United States Patent
Moriya et al.

(10) Patent No.: US 11,037,579 B2
(45) Date of Patent: *Jun. 15, 2021

(54) CODING METHOD, DEVICE AND RECORDING MEDIUM

(71) Applicant: Nippon Telegraph and Telephone Corporation, Chiyoda-ku (JP)

(72) Inventors: Takehiro Moriya, Atsugi (JP); Yutaka Kamamoto, Atsugi (JP); Noboru Harada, Atsugi (JP)

(73) Assignee: Nippon Telegraph and Telephone Corporation, Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/782,700

(22) Filed: Feb. 5, 2020

(65) Prior Publication Data

US 2020/0176006 A1 Jun. 4, 2020

Related U.S. Application Data

(63) Continuation of application No. 16/295,039, filed on Mar. 7, 2019, now Pat. No. 10,629,217, which is a
(Continued)

(30) Foreign Application Priority Data

Jul. 28, 2014 (JP) ................................ 2014-152958

(51) Int. Cl.
*G10L 19/22* (2013.01)
*H03M 7/30* (2006.01)
(Continued)

(52) U.S. Cl.
CPC .............. *G10L 19/22* (2013.01); *G10L 19/20* (2013.01); *H03M 7/30* (2013.01);
(Continued)

(58) Field of Classification Search
CPC ...... G10L 19/22; G10L 19/20; G10L 19/0017; G10L 19/02; G10L 19/0204; G10L 19/06; G10L 2019/0016; H03M 7/30
(Continued)

(56) References Cited

U.S. PATENT DOCUMENTS 5,764,763 A * 6/1998 Jensen .................... H04H 20/31
380/253
6,421,445 B1 * 7/2002 Jensen .................... H04H 20/31
380/253
(Continued)

FOREIGN PATENT DOCUMENTS

JP 2005-534950 A 11/2005
JP 2012-98735 A 5/2012

OTHER PUBLICATIONS

Combined Chinese Office Action and Search Report dated Feb. 3, 2020 in corresponding Chinese Patent Application No. 201580041465.4 (with English Translation), 31 page.
(Continued)

*Primary Examiner* — Edwin S Leland, III
(74) *Attorney, Agent, or Firm* — Oblon, McClelland, Maier & Neustadt, L.L.P.

(57) ABSTRACT

A coding technology that efficiently codes an input sound signal irrespective of the characteristics thereof and can obtain a decoded sound signal that sounds less artificial to a listener. A coding method codes an input sound signal frame by frame of a predetermined time segment by a selected coding processing from a plurality of types of coding processing in the frequency domain, the coding method makes it possible for a selection unit to select coding processing which is different from the coding processing of the preceding frame as coding processing of the present frame if at least one of the magnitude of the energy of high frequency components of the input sound signal of the
(Continued)

preceding frame and the magnitude of the energy of high frequency components of the input sound signal of the present frame is smaller than or equal to a predetermined threshold value.

5 Claims, 8 Drawing Sheets

Related U.S. Application Data continuation of application No. 15/327,490, filed as application No. PCT/JP2015/063989 on May 15, 2015, now Pat. No. 10,304,472.

(51) Int. Cl.
    *G10L 19/20*     (2013.01)
    *G10L 19/00*     (2013.01)
    *G10L 19/02*     (2013.01)
    *G10L 19/06*     (2013.01)

(52) U.S. Cl.
    CPC .......... *G10L 19/0017* (2013.01); *G10L 19/02* (2013.01); *G10L 19/0204* (2013.01); *G10L 19/06* (2013.01); *G10L 2019/0016* (2013.01)

(58) Field of Classification Search
    USPC ........................................................ 704/205
    See application file for complete search history.

(56) References Cited

U.S. PATENT DOCUMENTS

| | | | | | |
|---|---|---|---|---|---|
| 7,058,572 | B1* | 6/2006 | Nemer | ................ | G10L 21/0208 704/226 |
| 2005/0154584 | A1* | 7/2005 | Jelinek | ................ | G10L 19/005 704/219 |
| 2008/0027717 | A1* | 1/2008 | Rajendran | ............ | G10L 21/038 704/210 |
| 2008/0262835 | A1* | 10/2008 | Oshikiri | ............... | G10L 21/038 704/205 |
| 2008/0312914 | A1* | 12/2008 | Rajendran | ............... | G10L 19/08 704/207 |
| 2009/0192803 | A1* | 7/2009 | Nagaraja | ............... | G10L 19/012 704/278 |
| 2010/0324912 | A1* | 12/2010 | Choo | ................. | H03M 7/4018 704/500 |
| 2012/0221325 | A1 | 8/2012 | Choo | | |
| 2013/0117029 | A1* | 5/2013 | Liu | ......................... | G10L 19/20 704/500 |
| 2015/0332677 | A1* | 11/2015 | Vasilache | ............... | G10L 19/22 704/229 |
| 2016/0086613 | A1* | 3/2016 | Liu | ....................... | G10L 19/002 704/500 |
| 2016/0086615 | A1* | 3/2016 | Norvell | .................. | G10L 25/51 704/501 |
| 2016/0260444 | A1* | 9/2016 | Norvell | ................... | G10L 25/18 |
| 2016/0293173 | A1* | 10/2016 | Faure | ................. | G10L 19/0212 |
| 2016/0293174 | A1* | 10/2016 | Atti | ........................ | G10L 19/26 |
| 2016/0329056 | A1* | 11/2016 | Vasilache | .............. | G10L 19/008 |
| 2017/0169833 | A1* | 6/2017 | Lecomte | ............... | G10L 19/005 |
| 2017/0178659 | A1* | 6/2017 | Moriya | ................... | G10L 19/22 |

OTHER PUBLICATIONS

International Search Report dated Jul. 28, 2015 in PCT/JP2015/063989 filed May 15, 2015.
Anthony Vetro, "MPEG Unified Speech and Audio Coding", Industry and Standards, IEEE MultiMedia, (Apr.-Jun. 2013), pp. 72-78.
Marina Bosi, et al., "Introduction to Digital Audio Coding and Standards", Kluwer Academic Publishers, 6 pages, (2003).
Extended European Search Report dated Nov. 3, 2017 in Patent Application No. 15826810.2.
Japanese Office Action dated Mar. 13, 2018 in Patent Application No. 2016-538178, 7 pages (w/English translation).
Office Action issued in corresponding European Application No. 15826810.2 dated Mar. 14, 2018.
Office Action issued in corresponding European Application No. 15826810.2 dated Jul. 13, 2018.
Korean Office Action dated Sep. 13, 2018 in Korean Patent Application No. 10-2017-700223, 11 pages (w/English translation).
Korean Office Action dated Mar. 19, 2019 in Patent Application No. 10-2017-7002231, 6 pages (with English translation).
Office Action dated Jun. 18, 2019 in Japanese Patent Application No. 2018-083901 (w/English translation) 6 pages.
Office Action dated Jul. 1, 2019 in Korean Patent Application No. 10-2019-7011029 (w/English translation).
Extended European Search Report dated Nov. 27, 2019 in Patent Application No. 19201443.9, p. 1-8.

\* cited by examiner

CODING METHOD, DEVICE AND RECORDING MEDIUM

CROSS-REFERENCE TO RELATED APPLICATIONS

This application is a continuation of and claims the benefit of priority under 35 U.S.C. § 120 from U.S. application Ser. No. 16/295,039 filed Mar. 7, 2019, which is a continuation of U.S. application Ser. No. 15/327,490 filed Jan. 19, 2017 (now U.S. Pat. No. 10,304,472 issued May 28, 2019), the entire contents of which are incorporated herein by reference. U.S. application Ser. No. 15/327,490 is a National Stage of PCT/JP2015/063989 filed May 15, 2015, which claims the benefit of priority under 35 U.S.C. § 119 from Japanese Application No. 2014-152958 filed Jul. 28, 2014.

TECHNICAL FIELD

The present invention relates to a sound signal coding technology. More particularly, the present invention relates to a coding technology of coding a sound signal by converting the sound signal into the frequency domain.

BACKGROUND ART

In coding of sound signals such as speech and music, a method of coding an input sound signal in the frequency domain is widely used. As the method of coding a sound signal in the frequency domain, there are, for example, methods of Non-patent Literature 1 and Non-patent Literature 2.

The coding method described in Non-patent Literature 1 is a method that performs coding processing using a spectral envelope based on coefficients which are convertible into linear prediction coefficients. Specifically, the coding method described in Non-patent Literature 1 is a method that obtains a linear prediction coefficient code by coding coefficients which are obtained from an input sound signal and are convertible into linear prediction coefficients and obtains a normalized coefficient code by coding a normalized coefficient sequence which is obtained by normalizing a frequency domain coefficient sequence corresponding to the input sound signal by a spectral envelope coefficient sequence corresponding to coefficients which are convertible into quantized linear prediction coefficients corresponding to the linear prediction coefficient code. The coefficients which are convertible into linear prediction coefficients are, for example, linear prediction coefficients themselves, PARCOR coefficients (partial autocorrelation coefficients), LSP parameters, or the like.

The coding method described in Non-patent Literature 2 is a method that performs coding processing involving differential value variable-length coding by obtaining a differential between the logarithmic value of the average energy of coefficients in each frequency domain obtained by division and the logarithmic value of the average energy of an adjacent frequency domain. Specifically, the coding method described in Non-patent Literature 2 is a method that divides a frequency domain coefficient sequence corresponding to an input sound signal into frequency domains such that the lower the frequencies are, the smaller the number of samples of the frequency domain becomes; the higher the frequencies are, the greater the number of samples of the frequency domain becomes, obtains the average energy of each frequency domain obtained by division, and quantizes the average energy on the logarithmic axes; performs variable-length coding on a differential between the value obtained by quantization and the value obtained by quantizing the average energy of an adjacent frequency domain on the logarithmic axes in a similar manner; and adaptively determines, by using the average energy, which was quantized on the logarithmic axes, of each frequency domain obtained by division, a quantization bit number of each frequency domain coefficient and the quantization step width of each frequency domain coefficient, quantizes each frequency domain coefficient in accordance therewith, and further performs variable-length coding thereon.

PRIOR ART LITERATURE

Non-Patent Literature

Non-patent Literature 1: Anthony Vetro, "MPEG Unified Speech and Audio Coding", Industry and Standards, IEEE MultiMedia, April-June, 2013.

Non-patent Literature 2: M. Bosi and R. E. Goldberg, "Introduction to Digital Audio Coding and Standards", Kluwer Academic Publishers, 2003.

SUMMARY OF THE INVENTION

Problems to be Solved by the Invention

By the coding method of Non-patent Literature 2, since it is possible to reduce the code amount of an average energy code by performing variable-length coding on an average energy differential if the ascents and descents of a spectral envelope of an input sound signal are not steep and the degree of concentration of a spectrum is not high, it is possible to code the input sound signal efficiently. However, if the ascents and descents of a spectral envelope of an input sound signal are steep and the degree of concentration of a spectrum is high, the code amount of an average energy code which is obtained by performing variable-length coding on an average energy differential becomes large.

On the other hand, by the coding method of Non-patent Literature 1, since it is possible to code a spectral envelope efficiently by using coefficients which are convertible into linear prediction coefficients, it is possible to code an input sound signal more efficiently than the coding method of Non-patent Literature 2 if the ascents and descents of a spectral envelope of the input sound signal are steep and the degree of concentration of a spectrum is high. However, if the ascents and descents of a spectral envelope of an input sound signal are not steep and the degree of concentration of a spectrum is not high, it is not possible to perform coding as efficiently as the coding method of Non-patent Literature 2.

As described above, the existing coding methods sometimes cannot perform coding efficiently depending on the characteristics of an input sound signal.

An object of the present invention is to provide a coding method, a device, a program, and a recording medium that can perform coding efficiently irrespective of the characteristics of an input sound signal and obtain a decoded sound signal that sounds less artificial to a listener.

Means to Solve the Problems

A coding method according to one aspect of the present invention is a coding method that codes an input sound signal frame by frame of a predetermined time segment by a selected coding processing from a plurality of types of coding processing in the frequency domain, the coding method including: a selection step of making possible a selection to select coding processing which is different from coding processing of the preceding frame as coding processing of the present frame if at least one of the magnitude of the energy of high frequency components of an input sound signal of the preceding frame and the magnitude of the energy of high frequency components of an input sound signal of the present frame is smaller than or equal to a predetermined threshold value.

A coding method according to one aspect of the present invention is a coding method that codes an input sound signal frame by frame of a predetermined time segment by a selected coding processing from a plurality of types of coding processing in the frequency domain, the coding method including: a selection step of making possible a selection to select coding processing which is different from coding processing of the preceding frame as coding processing of the present frame if at least one of the magnitude of the energy of high frequency components of an input sound signal of the preceding frame and the magnitude of the energy of high frequency components of an input sound signal of the present frame is smaller than or equal to a predetermined threshold value; otherwise, deciding whether to make possible a selection to select coding processing which is different from the coding processing of the preceding frame as the coding processing of the present frame or select the same coding processing as the coding processing of the preceding frame as the coding processing of the present frame in accordance with a state in which the high frequency components of the input sound signal are sparse.

A coding method according to one aspect of the present invention is a coding method that codes an input sound signal frame by frame of a predetermined time segment by a selected coding processing from a plurality of types of coding processing in the frequency domain, the coding method including: a first coding step of coding a coefficient sequence in the frequency domain corresponding to the input sound signal by using a spectral envelope based on coefficients which are convertible into linear prediction coefficients corresponding to the input sound signal; a second coding step of coding the coefficient sequence in the frequency domain corresponding to the input sound signal, involving variable-length coding which is performed on a differential between the logarithmic value of the average energy of coefficients in each frequency domain obtained by division and the logarithmic value of the average energy of an adjacent frequency domain; and a selection step of making possible a selection to code the present frame in the first coding step if the ascents and descents of a spectrum of the input sound signal of the present frame are steep or the degree of concentration of the spectrum is high and making possible a selection to code the present frame in the second coding step if the ascents and descents of the spectrum of the input sound signal of the present frame are gentle or the degree of concentration of the spectrum is low.

Effects of the Invention

With a configuration that allows any one of a plurality of types of coding processing performing coding frame by frame in the frequency domain to be selected, it is possible to obtain a decoded sound signal that sounds less artificial to a listener.

DETAILED DESCRIPTION OF THE EMBODIMENTS

First Embodiment

Hereinafter, a first embodiment of the present invention will be described. The first embodiment is configured such that, in a configuration in which a coefficient sequence in the frequency domain corresponding to an input sound signal of each frame is coded by any one of a plurality of different types of coding processing that performs coding processing in the frequency domain, switching of coding processing is performed only when the energy of high frequency components of an input sound signal or/and a coefficient sequence in the frequency domain corresponding to the input sound signal is small. The energy of high frequency components of an input sound signal is the magnitude itself of the energy of high frequency components of an input sound signal, the magnitude of the energy of high frequency components in an input sound signal, or the like.

<Coding Device 300>

Figure 1:
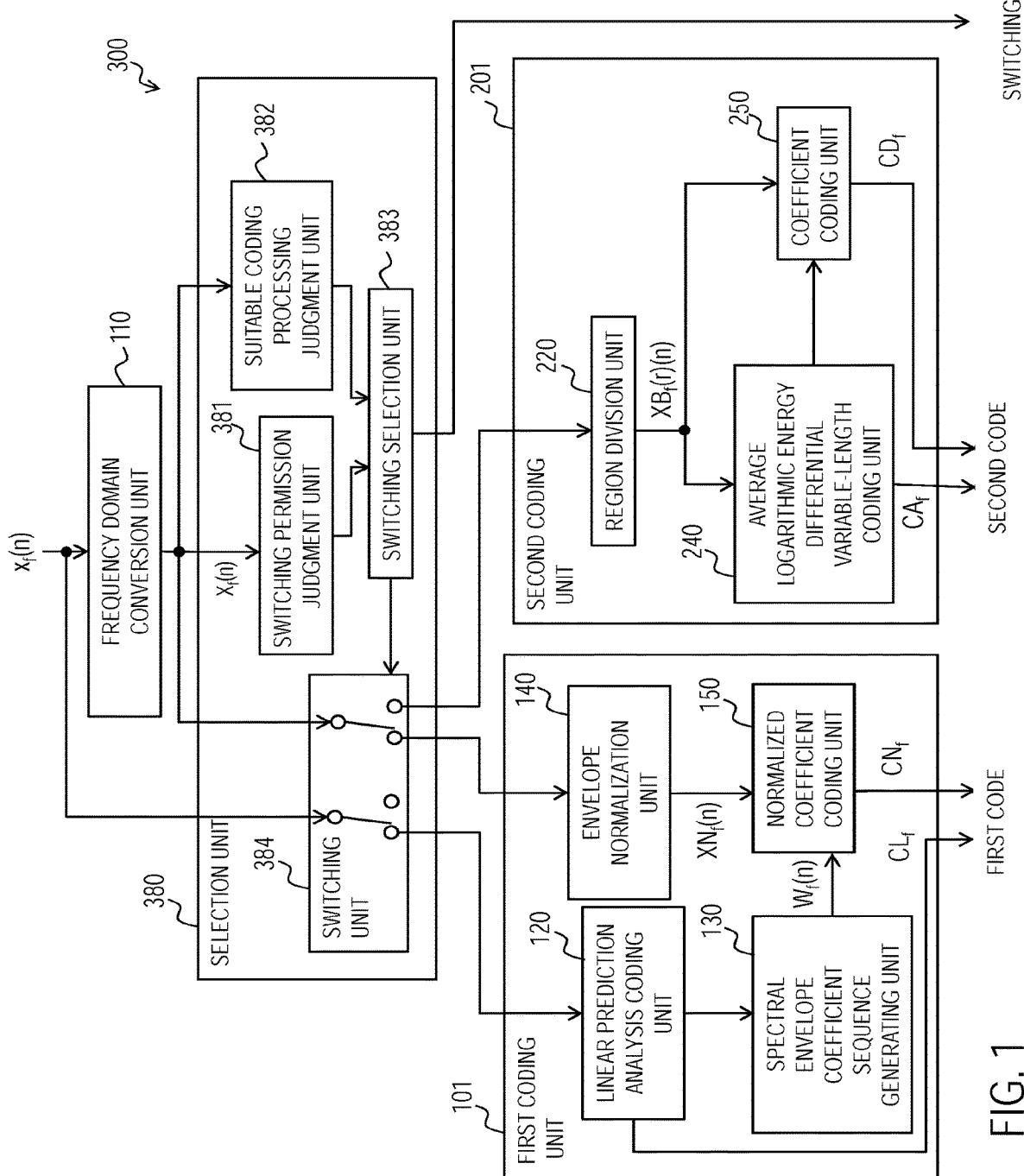
FIG. 1 is a block diagram illustrating the configuration of a coding device.

The configuration of a coding device 300 is depicted in FIG. 1. The coding device 300 includes a frequency domain conversion unit 110, a selection unit 380, a first coding unit 101, and a second coding unit 201. The first coding unit 101 includes, for example, a linear prediction analysis coding unit 120, a spectral envelope coefficient sequence generating unit 130, an envelope normalization unit 140, and a normalized coefficient coding unit 150. The second coding unit 201 includes, for example, a region division unit 220, an average logarithmic energy differential variable-length coding unit 240, and a coefficient coding unit 250. To the coding device 300, a speech sound digital signal (hereinafter referred to as an input sound signal) in the time domain is input frame by frame which is a predetermined time segment, and the following processing is performed on a frame-by-frame basis. Hereinafter, specific processing of each unit will be described based on the premise that the present input sound signal is an f-th frame. An input sound signal of the f-th frame is assumed to be $x_f(n)$ ($n=1, \ldots, Nt$). Here, Nt represents the number of samples per frame.

Figure 3:
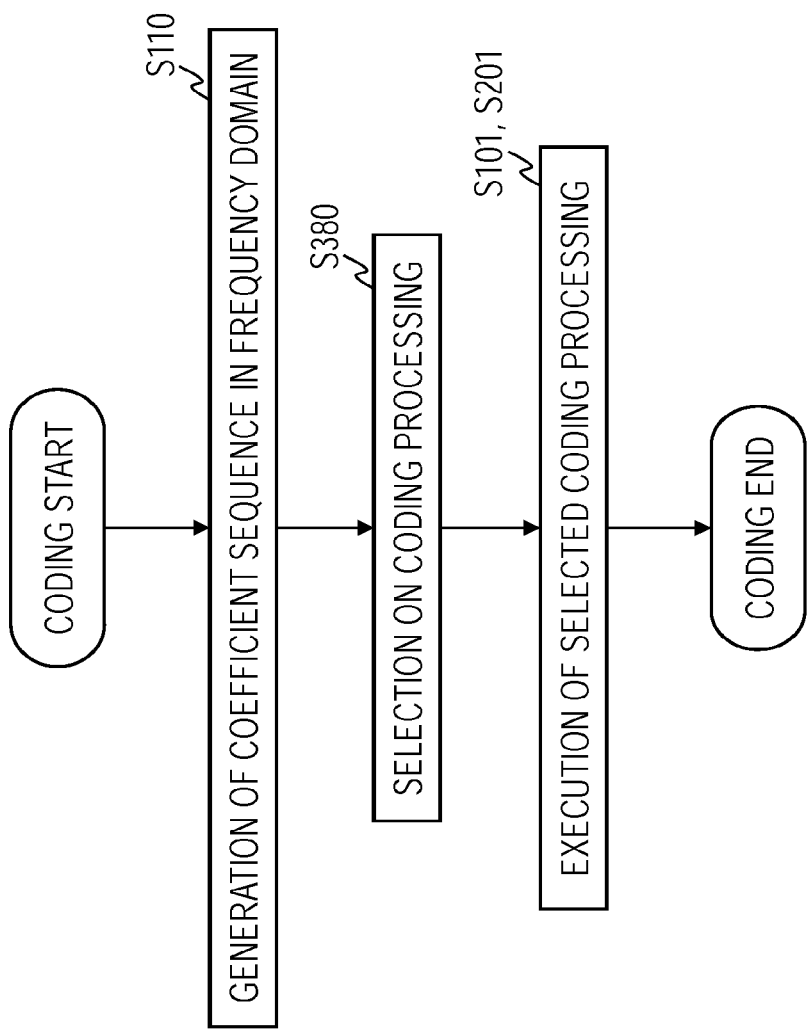
FIG. 3 is a diagram depicting an example of the flow of processing of a coding method.

Hereinafter, the operation of the coding device 300 will be described. By the coding device 300, processing in each step of a coding method illustrated in FIG. 3 is performed.

<Frequency Domain Conversion Unit 110>

The frequency domain conversion unit 110 converts the input sound signal $x_f(n)$ ($n=1, \ldots, Nt$) into a coefficient sequence in the frequency domain, for example, an MDCT coefficient sequence $X_f(n)$ ($n=1, \ldots, N$) at point N and outputs the MDCT coefficient sequence $X_f(n)$ (n=1, ..., N) (Step S110). However, N is the number of samples in the frequency domain and is a positive integer. Conversion into the frequency domain may be performed by a publicly known conversion method which is not MDCT.

Moreover, if coefficient sequences in the frequency domain obtained at a plurality of degrees of accuracy and by a plurality of methods are necessary in the first coding unit 101, the second coding unit 201, and the selection unit 380, it is possible to obtain coefficient sequences in the frequency domain at a plurality of degrees of accuracy and by a plurality of methods in the frequency domain conversion unit 110. For example, when the first coding unit 101 and the second coding unit 201 use an MDCT coefficient sequence as a coefficient sequence in the frequency domain and the selection unit 380 uses a power spectral series as a coefficient sequence in the frequency domain, the frequency domain conversion unit 110 simply has to obtain an MDCT coefficient sequence and a power spectral series from an input sound signal. Furthermore, for example, when the first coding unit 101 and the second coding unit 201 use an MDCT coefficient sequence as a coefficient sequence in the frequency domain and the selection unit 380 uses a series of energy of each frequency band as a coefficient sequence in the frequency domain, the frequency domain conversion unit 110 simply has to obtain an MDCT coefficient sequence and a series of energy of each frequency band from an input sound signal. In addition, for example, when the first coding unit 101 and the second coding unit 201 use an MDCT coefficient sequence as a coefficient sequence in the frequency domain, a switching permission judgment unit 381 of the selection unit 380 uses a series of energy of each frequency band as a coefficient sequence in the frequency domain, and a suitable coding processing judgment unit 382 of the selection unit 380 uses a power spectral series as a coefficient sequence in the frequency domain, the frequency domain conversion unit 110 simply has to obtain an MDCT coefficient sequence, a series of energy of each frequency band, and a power spectral series from an input sound signal.

<Selection Unit 380>

The selection unit 380 makes it possible to select coding processing which is different from the coding processing of the preceding frame as coding processing of the present frame if at least one of the magnitude of the energy of high frequency components of the input sound signal of the preceding frame and the magnitude of the energy of high frequency components of the input sound signal of the present frame is smaller than a predetermined threshold value (Step S380).

In other words, the selection unit 380 makes a judgment to the effect that, if at least the energy of high frequency components of an input sound signal is small, the selection unit 380 allows a coefficient sequence in the frequency domain of the present frame to be coded by coding processing which is different from the coding processing by which the coefficient sequence in the frequency domain of the preceding frame was coded; otherwise, the selection unit 380 does not allow the coefficient sequence in the frequency domain of the present frame to be coded by coding processing which is different from the coding processing by which the coefficient sequence in the frequency domain of the preceding frame was coded. The selection unit 380 then performs switching control such that the coefficient sequence in the frequency domain of the present frame is coded in accordance with the judgment result.

Figure 4:
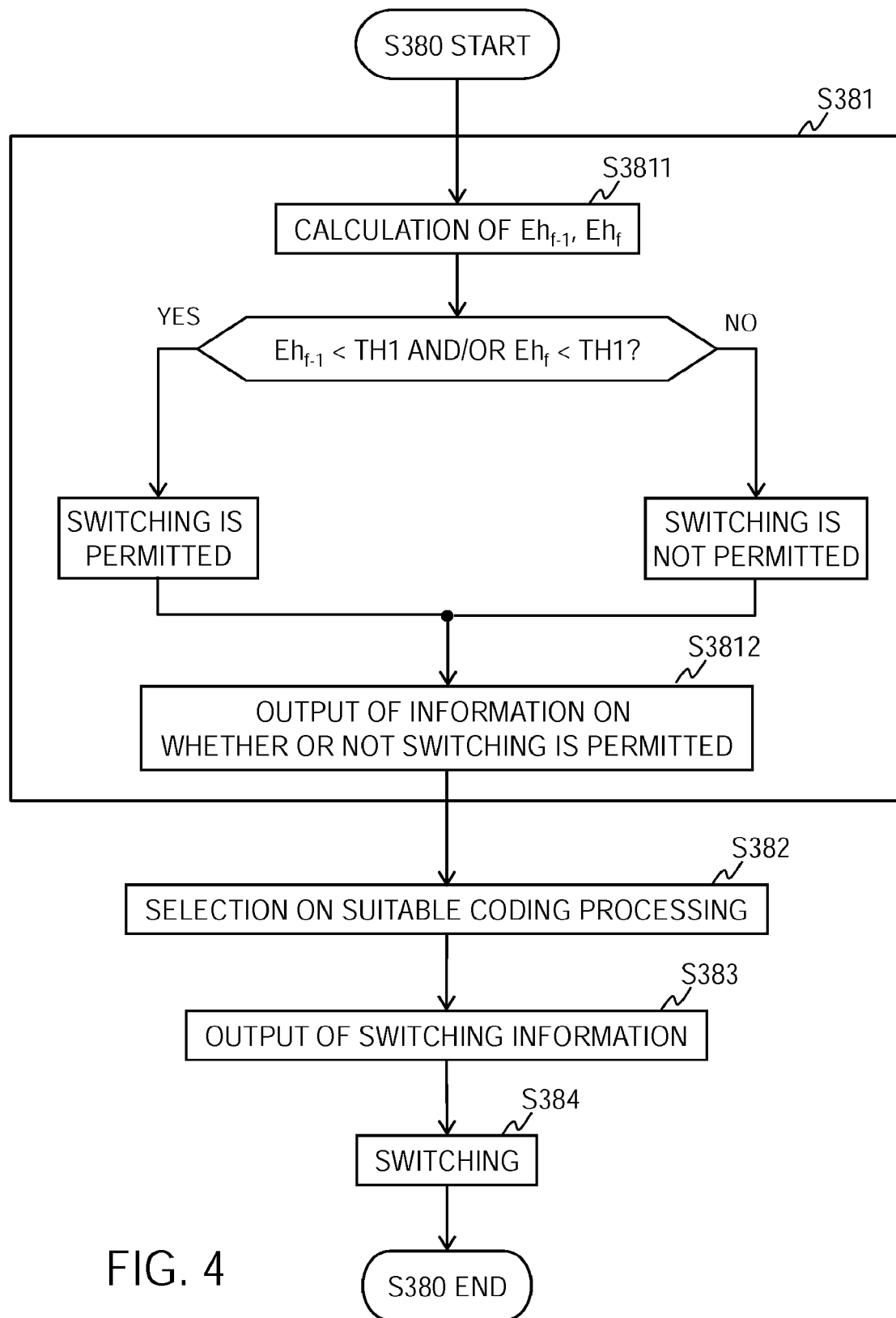
FIG. 4 is a diagram depicting an example of the flow of processing of a selection unit 380.

The selection unit 380 includes, for example, the switching permission judgment unit 381, the suitable coding processing judgment unit 382, a switching selection unit 383, and a switching unit 384. Hereinafter, an example of the selection unit 380 will be described. The selection unit 380 performs processing in each step illustrated in FIG. 4.

<Switching Permission Judgment Unit 381>

The switching permission judgment unit 381 judges that, if at least one of the magnitude of the energy of high frequency components of the input sound signal of the preceding frame and the magnitude of the energy of high frequency components of the input sound signal of the present frame is smaller than a predetermined threshold value, switching is permitted, that is, judges that the switching permission judgment unit 381 makes it possible to code the coefficient sequence in the frequency domain of the present frame by coding processing which is different from the coding processing by which the coefficient sequence in the frequency domain of the preceding frame was coded; otherwise, the switching permission judgment unit 381 judges that switching is not permitted, that is, the switching permission judgment unit 381 does not allow the coefficient sequence in the frequency domain of the present frame to be coded by coding processing which is different from the coding processing by which the coefficient sequence in the frequency domain of the preceding frame was coded; the switching permission judgment unit 381 then outputs the judgment result (Step S381).

Hereinafter, an example of the operation of the switching permission judgment unit 381 will be described. First, an example in which the high frequency energy of an MDCT coefficient sequence is used as the magnitude of the energy of high frequency components of an input sound signal will be described.

The switching permission judgment unit 381 first obtains the high frequency energy $Eh_{f-1}$ of an MDCT coefficient sequence $X_{f-1}(n)$ (n=1, ..., N) of the preceding frame by the following formula (1) and the high frequency energy $Eh_f$ of an MDCT coefficient sequence $X_f(n)$ (n=1, ..., N) of the present frame by the following formula (2) (Step S3811). In formula (1) and formula (2), M is a predetermined positive integer which is smaller than N.

$$Eh_{f-1} = \sum_{n=N-M}^{N} (X_{f-1}(n))^2 \quad (1)$$

$$Eh_f = \sum_{n=N-M}^{N} (X_f(n))^2 \quad (2)$$

The switching permission judgment unit 381 then judges that, if at least one of the high frequency energy $Eh_{f-1}$ of the preceding frame and the high frequency energy $Eh_f$ of the present frame is smaller than a predetermined threshold value TH1, that is, $Eh_{f-1}$<TH1 and/or $Eh_f$<TH1, switching is permitted; otherwise, the switching permission judgment unit 381 judges that switching is not permitted; the switching permission judgment unit 381 then outputs information on whether or not switching is permitted (Step S3812).

Incidentally, the high frequency energy $Eh_{f-1}$ of the preceding frame which is obtained in Step S3811 of the present frame is the same as the high frequency energy $Eh_f$ of the present frame obtained in Step S3811 of the preceding frame. Thus, by storing the calculated high frequency energy $Eh_f$ in the switching permission judgment unit 381 until at least a frame immediately following the frame, there is no need to calculate the high frequency energy $Eh_{f-1}$ of the preceding frame.

Next, an example in which the ratio of high frequency energy to the total energy of an MDCT coefficient sequence is used as the magnitude of the energy of high frequency components of an input sound signal will be described.

The switching permission judgment unit 381 first obtains the ratio $Eh_{f-1}$ of high frequency energy to the total energy of an MDCT coefficient sequence $X_{f-1}(n)$ (n=1, ..., N) of the preceding frame by the following formula (1A) and the ratio $Eh_f$ of high frequency energy to the total energy of the MDCT coefficient sequence $X_f(n)$ (n=1, ..., N) of the present frame by the following formula (2A) (Step S3811). In formula (1A) and formula (2A), M is a predetermined positive integer.

$$Eh_{f-1} = \frac{\sum_{n=N-M}^{N} (X_{f-1}(n))^2}{\sum_{n=1}^{N} (X_{f-1}(n))^2} \quad (1A)$$

$$Eh_f = \frac{\sum_{n=N-M}^{N} (X_f(n))^2}{\sum_{n=1}^{N} (X_f(n))^2} \quad (2A)$$

The switching permission judgment unit 381 then judges that, if at least one of the ratio $Eh_{f-1}$ of high frequency energy to the total energy of the preceding frame and the ratio $Eh_f$ of high frequency energy to the total energy of the present frame is smaller than the predetermined threshold value TH1, that is, $Eh_{f-1}$<TH1 and/or $Eh_f$<TH1, switching is permitted; otherwise, the switching permission judgment unit 381 judges that switching is not permitted; the switching permission judgment unit 381 then outputs information on whether or not switching is permitted (Step S3812).

Incidentally, the ratio $Eh_{f-1}$ of high frequency energy to the total energy of the preceding frame which is obtained in Step S3811 of the present frame is the same as the ratio $Eh_f$ of high frequency energy to the total energy of the present frame obtained in Step S3811 of the preceding frame. Thus, by storing the calculated ratio $Eh_f$ of high frequency energy to the total energy in the switching permission judgment unit 381 until at least a frame immediately following the frame, there is no need to calculate the ratio $Eh_{f-1}$ of high frequency energy to the total energy of the preceding frame.

Incidentally, in the above-described two examples, it is judged that switching is permitted if $Eh_{f-1}$<TH1 and/or $Eh_f$<TH1; otherwise, it is judged that switching is not permitted, but it may be judged that switching is permitted if $Eh_{f-1}$<TH1 and $Eh_f$<TH1; otherwise, it may be judged that switching is not permitted. In other words, it may be judged that, if both the magnitude of the energy of high frequency components of the input sound signal of the preceding frame and the magnitude of the energy of high frequency components of the input sound signal of the present frame are smaller than a predetermined threshold value, switching is permitted, that is, coding of the coefficient sequence in the frequency domain of the present frame by coding processing which is different from the coding processing by which the coefficient sequence in the frequency domain of the preceding frame was coded is made possible; otherwise, it may be judged that switching is not permitted, that is, coding of the coefficient sequence in the frequency domain of the present frame by coding processing which is different from the coding processing by which the coefficient sequence in the frequency domain of the preceding frame was coded is not allowed.

Moreover, in the above-described examples, high frequency energy and the ratio of high frequency energy to the total energy are obtained by using an MDCT coefficient sequence, but high frequency energy and the ratio of high frequency energy to the total energy may be obtained by using a power spectral series or a series of energy of each frequency band.

<Suitable Coding Processing Judgment Unit 382>

The suitable coding processing judgment unit 382 makes a judgment as to whether a coefficient sequence in the frequency domain corresponding to the input sound signal of the present frame is suitable for coding processing of the first coding unit 101 or coding processing of the second coding unit 201 and outputs the judgment result (Step S382).

Figure 5:
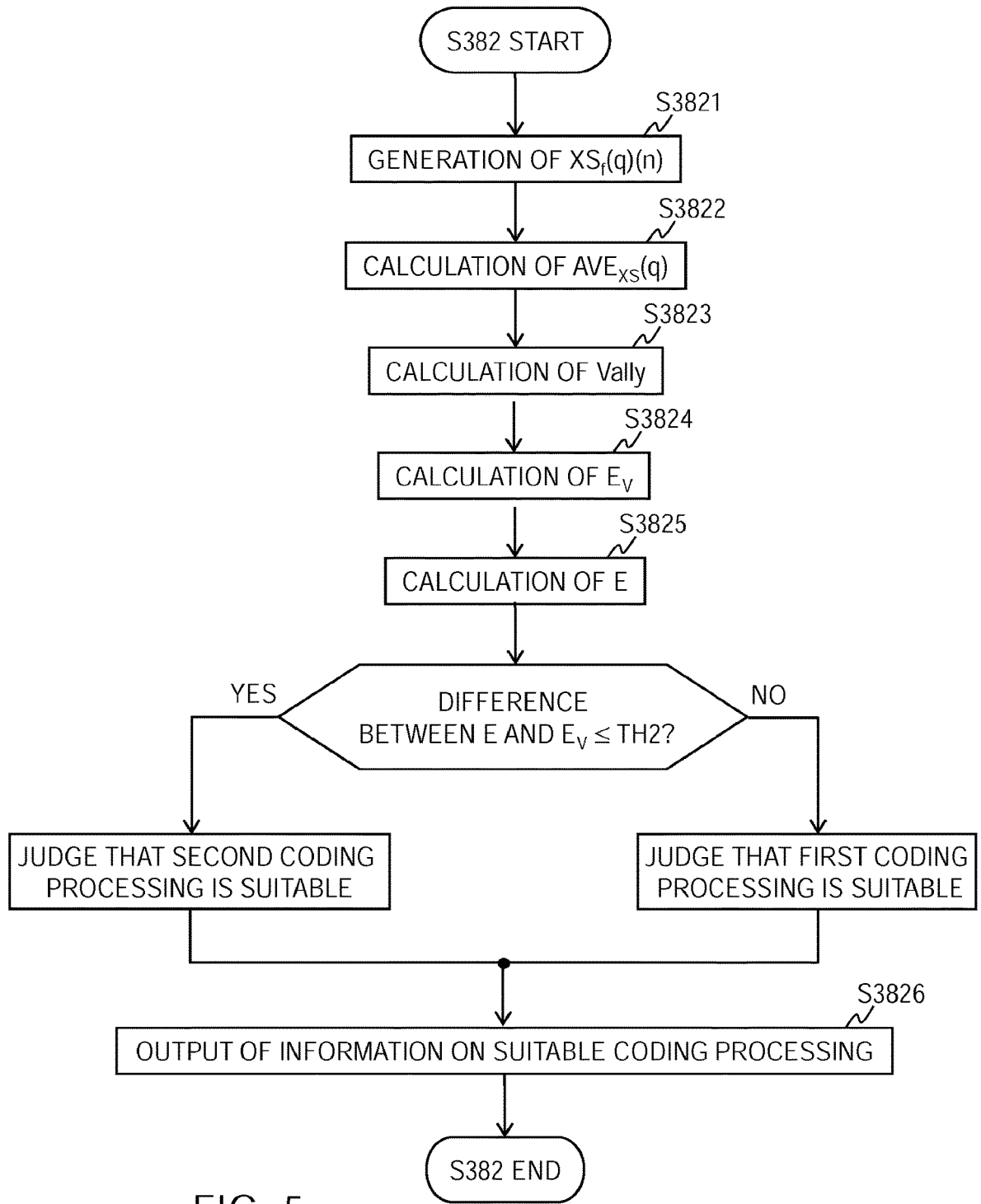
FIG. 5 is a diagram depicting an example of the flow of processing of a suitable coding processing judgment unit 382.

Hereinafter, an example of the operation of the suitable coding processing judgment unit 382 will be described. The suitable coding processing judgment unit 382 performs processing in each step illustrated in FIG. 5. In the following example, the coding processing of the first coding unit 101 is coding processing using a spectral envelope based on coefficients which are convertible into linear prediction coefficients, which is illustrated in Non-patent Literature 1, and the coding processing of the second coding unit 201 is coding processing involving variable-length coding which is performed on a differential between the logarithmic value of the average energy of coefficients in each frequency domain obtained by division and the logarithmic value of the average energy of an adjacent frequency domain, which is illustrated in Non-patent Literature 2.

In this example, if the ascents and descents of a spectral envelope of an input sound signal are steep or/and the degree of concentration of the spectral envelope is high, it is judged that a coefficient sequence in the frequency domain corresponding to the input sound signal of the present frame is suitable for the coding processing of the first coding unit 101; if the ascents and descents of a spectral envelope of an input sound signal are gentle or/and the degree of concentration of the spectral envelope is low, it is judged that the coefficient sequence in the frequency domain corresponding to the input sound signal of the present frame is suitable for the coding processing of the second coding unit 201. The judgment result is then output.

As a method of estimating the ascents and descents and the degree of concentration of a spectrum, any method may be adopted; in the following example, a configuration in which the depth of the valley of a spectrum or the envelope thereof is estimated will be described. In this configuration, it is judged that the ascents and descents of a spectrum are gentle and the degree of concentration of the spectrum is low if the valley of the spectrum or the envelope thereof is shallow and that the ascents and descents of a spectrum are steep and the degree of concentration of the spectrum is high if the valley of the spectrum or the envelope thereof is deep. The shallow valley of a spectrum or the envelope thereof translates into a high noise floor. Moreover, the deep valley of a spectrum or the envelope thereof translates into a low noise floor.

The suitable coding processing judgment unit 382 first divides the MDCT coefficient sequence $X_f(n)$ (n=1, ..., N) of the present frame into Q partial coefficient sequences $XS_f(1)(n)$ (n=1, ..., P), $XS_f(2)(n)$ (n=1, ..., P), ..., $XS_f(Q)(n)$ (n=1, ..., P), each having P samples (Step S3821). P and Q are positive integers that satisfy the relationship P×Q=N. P may be 1. Moreover, here, a configuration in which an MDCT coefficient sequence $X_f(n)$ (n=1, ..., N) which is a coefficient sequence in the frequency domain that is to be subjected to coding processing in the first coding unit 101 or in the second coding unit 201 is also used in the suitable coding processing judgment unit 382 is adopted, but a coefficient sequence in the frequency domain obtained by conversion into the frequency domain at a different degree of accuracy and by a different method from those adopted for the MDCT coefficient sequence $X_f(n)$ (n=1, ..., N), for example, a power spectral series may be used as an object on which processing by the suitable coding processing judgment unit 382 is to be performed.

The suitable coding processing judgment unit 382 then obtains a series $AVE_{XS}(q)$ (q=1, ..., Q) formed of the mean value of power or the logarithmic value thereof of each of the partial coefficient sequences $XS_f(1)(n)$ (n=1, ..., P), $XS_f(2)(n)$ (n=1, ..., P), ..., $XS_f(Q)(n)$ (n=1, ..., P) (Step S3822). The mean value of power is $AVE_{XS}(q)$ obtained by formula (3). Moreover, the logarithmic value of the mean value of power is $AVE_{XS}(q)$ obtained by formula (3A).

$$AVE_{XS}(q) = \frac{\sum_{n=1}^{P}(XS_f(q)(n))^2}{P} \quad (3)$$

$$AVE_{XS}(q) = \log\left(\frac{\sum_{n=1}^{P}(XS_f(q)(n))^2}{P}\right) \quad (3A)$$

The suitable coding processing judgment unit 382 then judges, for each element of the series $AVE_{XS}(1)$, $AVE_{XS}(2)$, ..., $AVE_{XS}(Q)$ formed of the mean value of power or the logarithmic value of the mean value of power, whether or not the element is smaller than both of two adjacent elements and obtains the number of elements judged to be smaller than both of two adjacent elements (Step S3823). That is, the suitable coding processing judgment unit 382 obtains the number Vally of q that satisfies formula (4).

$$AVE_{XS}(q)-\min(AVE_{XS}(q-1),AVE_{XS}(q+1))<0 \quad (4)$$

The suitable coding processing judgment unit 382 then obtains the mean value $E_V$ of Vally $AVE_{XS}(q)$ corresponding to q that satisfies formula (4), that is, the mean value $E_V$ of the partial regions of the valley (Step S3824). If $AVE_{XS}(q)$ is the mean value of power, $E_V$ obtained in Step S3824 is the mean value of power of the partial regions in a portion of the valley. If $AVE_{XS}(q)$ is the logarithmic value of the mean value of power, $E_V$ obtained in Step S3824 is the mean value of the logarithmic value of the mean value of power of the partial regions in a portion of the valley. Moreover, the suitable coding processing judgment unit 382 obtains the mean value of power or the logarithmic value of the mean value of power of all the partial regions (Step S3825). The mean value of power of all the partial regions is the mean value of power of the MDCT coefficient sequence $X_f(n)$ (n=1, ..., N) and is E obtained by formula (11). The logarithmic value of the mean value of power of all the partial regions is the logarithmic value of the mean value of power of the MDCT coefficient sequence $X_f(n)$ (n=1, ..., N) and is E obtained by formula (11A).

$$E = \frac{\sum_{n=1}^{N}(X_f(n))^2}{N} \quad (11)$$

$$E = \log\left(\frac{\sum_{n=1}^{N}(X_f(n))^2}{N}\right) \quad (11A)$$

The suitable coding processing judgment unit 382 then judges that, since it is estimated that the valley of a spectrum is shallow and the spectrum is a spectrum whose spectral envelope has gentle ascents and descents or whose degree of concentration is low if a difference between the mean value E of $AVE_{XS}(q)$ of all the partial regions and the mean value $E_V$ of $AVE_{XS}(q)$ of the partial regions of the valley is smaller than or equal to a predetermined threshold value TH2, a coefficient sequence in the frequency domain corresponding to the input sound signal of the present frame is suitable for the coding processing of the second coding unit 201. Conversely, since it is estimated that the valley of a spectrum is deep and the spectrum is a spectrum whose spectral envelope has steep ascents and descents or whose degree of concentration is high if a difference between the mean value E of $AVE_{XS}(q)$ of all the partial regions and the mean value $E_V$ of $AVE_{XS}(q)$ of the partial regions of the valley is greater than the threshold value TH2, the suitable coding processing judgment unit 382 judges that a coefficient sequence in the frequency domain corresponding to the input sound signal of the present frame is suitable for the coding processing of the first coding unit 101. The suitable coding processing judgment unit 382 outputs information on which coding processing is suitable (Step S3826). The information on suitable coding processing is also referred to as suitability information.

Moreover, in Step S3821, different sample numbers may be adopted for different partial coefficient sequences. For example, the MDCT coefficient sequence $X_f(n)$ (n=1, ..., N) of the present frame may be divided into Q partial coefficient sequences $XS_f(1)(n)$ (n=1, ..., $P_1$), $XS_f(2)(n)$ (n=1, ..., $P_2$), ..., $XS_f(Q)(n)$ (n=1, ..., $P_Q$). $P_1$, $P_2$, ..., $P_Q$ are positive integers that satisfy $P_1+P_2+ ... +P_Q=N$. Furthermore, it is preferable that $P_1$, $P_2$, ..., $P_Q$ satisfy $P_1 \leq P_2 \leq ... \leq P_Q$. In addition, Q is a positive integer.

<Switching Selection Unit 383>

Based on the information on whether or not switching is permitted that was obtained by the switching permission judgment unit 381 and the information on which coding processing is suitable that was obtained by the suitable coding processing judgment unit 382, the switching selection unit 383 selects whether to code the coefficient sequence in the frequency domain of the present frame in the first coding unit 101 or in the second coding unit 201 and outputs a switching code that is a code by which the selected coding processing can be identified (Step S383). The output switching code is input to a decoding device 400. Here, if switching is not permitted, the switching selection unit 383 selects to code the coefficient sequence in the frequency domain of the present frame by the same coding processing as the coding processing of the preceding frame irrespective of the coding processing for which the present frame is suitable. Moreover, if switching is permitted, the switching selection unit 383 selects to code the coefficient sequence in the frequency domain of the present frame by the coding processing for which the present frame is suitable irrespective of the coding processing of the preceding frame. However, there may be a case where, even when switching is permitted, the switching selection unit 383 selects to code the coefficient sequence in the frequency domain of the present frame by the same coding processing as the coding processing of the preceding frame, not by the coding processing for which the present frame is suitable.

Hereinafter, an example of the operation of the switching selection unit 383 will be described. In the following example, the coding processing of the first coding unit 101 is coding processing using a spectral envelope based on coefficients which are convertible into linear prediction coefficients, which is illustrated in Non-patent Literature 1, and the coding processing of the second coding unit 201 is coding processing involving variable-length coding which is performed on a differential between the logarithmic value of the average energy of coefficients in each frequency domain obtained by division and the logarithmic value of the average energy of an adjacent frequency domain, which is illustrated in Non-patent Literature 2.

If the information on whether or not switching is permitted that was obtained by the switching permission judgment unit 381 indicates that switching is not permitted and/or the information on which coding processing is suitable that was obtained by the suitable coding processing judgment unit 382 indicates that the same coding processing as the coding processing performed on the MDCT coefficient sequence $X_{f-1}(n)$ (n=1, ..., N) of the preceding frame, the switching selection unit 383 selects the same coding processing as the coding processing performed on the MDCT coefficient sequence $X_{f-1}(n)$ (n=1, ..., N) of the preceding frame as the coding processing which is performed on the MDCT coefficient sequence $X_f(n)$ (n=1, ..., N) of the present frame.

That is, if the MDCT coefficient sequence $X_{f-1}(n)$=1, ..., N) of the preceding frame was coded in the first coding unit 101 and the information on whether or not switching is permitted that was obtained by the switching permission judgment unit 381 indicates that switching is not permitted, the switching selection unit 383 selects to code the MDCT coefficient sequence $X_f(n)$ (n=1, ..., N) of the present frame also in the first coding unit 101. Moreover, if the MDCT coefficient sequence $X_{f-1}(n)$ (n=1, ..., N) of the preceding frame was coded in the first coding unit 101 and the information on which coding processing is suitable that was obtained by the suitable coding processing judgment unit 382 indicates the coding processing of the first coding unit 101, the switching selection unit 383 also selects to code the MDCT coefficient sequence $X_f(n)$ (n=1, ..., N) of the present frame also in the first coding unit 101.

Moreover, if the MDCT coefficient sequence $X_{f-1}(n)$ (n=1, ..., N) of the preceding frame was coded in the second coding unit 201 and the information on whether or not switching is permitted that was obtained by the switching permission judgment unit 381 indicates that switching is not permitted, the switching selection unit 383 selects to code the MDCT coefficient sequence $X_f(n)$ (n=1, ..., N) of the present frame also in the second coding unit 201. Furthermore, if the MDCT coefficient sequence $X_{f-1}(n)$ (n=1, ..., N) of the preceding frame was coded in the second coding unit 201 and the information on which coding processing is suitable that was obtained by the suitable coding processing judgment unit 382 indicates the coding processing of the second coding unit 201, the switching selection unit 383 also selects to code the MDCT coefficient sequence $X_f(n)$ (n=1, ..., N) of the present frame also in the second coding unit 201.

If the information on whether or not switching is permitted that was obtained by the switching permission judgment unit 381 indicates that switching is permitted and the information on which coding processing is suitable that was obtained by the suitable coding processing judgment unit 382 indicates coding processing which is different from the coding processing performed on the MDCT coefficient sequence $X_{f-1}(n)$ (n=1, ..., N) of the preceding frame, the switching selection unit 383 selects the coding processing which is different from the coding processing performed on the MDCT coefficient sequence $X_{f-1}(n)$ (n=1, ..., N) of the preceding frame as coding processing which is performed on the MDCT coefficient sequence $X_f(n)$ (n=1, ..., N) of the present frame. That is, if the MDCT coefficient sequence $X_{f-1}(n)$ (n=1, ..., N) of the preceding frame was coded in the first coding unit 101 and the information on whether or not switching is permitted that was obtained by the switching permission judgment unit 381 indicates that switching is permitted and the information on which coding processing is suitable that was obtained by the suitable coding processing judgment unit 382 indicates the coding processing of the second coding unit 201, the switching selection unit 383 selects to code the MDCT coefficient sequence $X_f(n)$ (n=1, ..., N) of the present frame in the second coding unit 201. Moreover, if the MDCT coefficient sequence $X_{f-1}(n)$ (n=1, ..., N) of the preceding frame was coded in the second coding unit 201 and the information on whether or not switching is permitted that was obtained by the switching permission judgment unit 381 indicates that switching is permitted and the information on which coding processing is suitable that was obtained by the suitable coding processing judgment unit 382 indicates the coding processing of the first coding unit 101, the switching selection unit 383 selects to code the MDCT coefficient sequence $X_f(n)$ (n=1, ..., N) of the present frame in the first coding unit 101.

<Switching Unit 384>

The switching unit 384 performs control so as to input the MDCT coefficient sequence $X_f(n)$ (n=1, ..., N) output from the frequency domain conversion unit 110 to the first coding unit 101 or the second coding unit 201 such that the MDCT coefficient sequence $X_f(n)$ (n=1, ..., N) of the present frame is coded by the coding processing selected by the switching selection unit 383 (Step S384). Moreover, if the input sound signal $x_f(n)$ (n=1, ..., Nt) of the present frame is also necessary for coding of the MDCT coefficient sequence $X_f(n)$ (n=1, ..., N) of the present frame, the switching unit 384 also inputs the input sound signal $x_f(n)$ (n=1, ..., Nt) of the present frame to the first coding unit 101 or/and the second coding unit 201.

For example, if the coding processing of the first coding unit 101 is coding processing using a spectral envelope based on coefficients which are convertible into linear prediction coefficients, which is illustrated in Non-patent Literature 1, and the coding processing of the second coding unit 201 is coding processing involving variable-length coding which is performed on a differential between the average energy of coefficients in each frequency domain obtained by division and the average energy of an adjacent frequency domain, which is illustrated in Non-patent Literature 2, since the input sound signal $x_f(n)$ (n=1, ..., Nt) of the present frame is necessary only in the first coding unit 101, the switching unit 384 also inputs the input sound signal $x_f(n)$ (n=1, ..., Nt) of the present frame to the first coding unit 101 when inputting the MDCT coefficient sequence $X_f(n)$ (n=1, ..., N) to the first coding unit 101.

<First Coding Unit 101, Second Coding Unit 201>

Both the first coding unit 101 and the second coding unit 201 perform coding processing of coding a coefficient sequence in the frequency domain, but the first coding unit 101 and the second coding unit 201 perform different types of coding processing. That is, the first coding unit 101 codes a coefficient sequence in the frequency domain of the present frame by coding processing which is different from the coding processing of the second coding unit 201 and outputs a first code which is a code thus obtained (Step S101). Moreover, the second coding unit 201 codes a coefficient sequence in the frequency domain of the present frame by coding processing which is different from the coding processing of the first coding unit 101 and outputs a second code which is a code thus obtained (Step S201). For example, the first coding unit 101 performs coding processing using a spectral envelope based on coefficients which are convertible into linear prediction coefficients, and the second coding unit 201 performs coding processing using the average energy of coefficients in each frequency domain obtained by division.

Hereinafter, an example of the operation of the first coding unit 101 and the second coding unit 201 will be described. In the following example, the coding processing of the first coding unit 101 is coding processing using a spectral envelope based on coefficients which are convertible into linear prediction coefficients, which is illustrated in Non-patent Literature 1, and the coding processing of the second coding unit 201 is coding processing involving variable-length coding which is performed on a differential between the average energy of coefficients in each frequency domain obtained by division and the average energy of an adjacent frequency domain, which is illustrated in Non-patent Literature 2.

Figure 8:
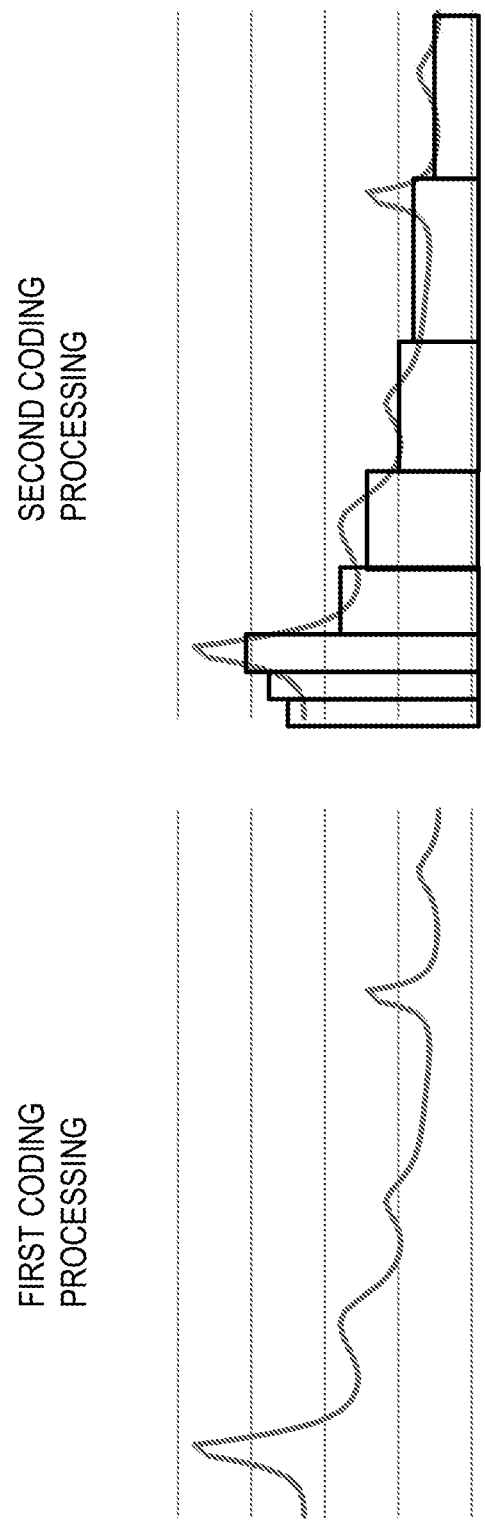
FIG. 8 is a conceptual diagram of first coding processing and second coding processing.

In this example, as illustrated on the left side of FIG. 8, first coding processing by the first coding unit 101 expresses a spectral envelope shape in the frequency domain by coefficients which are convertible into linear prediction coefficients. On the other hand, as illustrated on the right side of FIG. 8, second coding processing by the second coding unit 201 expresses an envelope shape by a scale factor band (division of a frequency domain coefficient sequence into a plurality of regions). It can be said that the second coding processing is very efficient if the mean value changes smoothly because the second coding processing uses variable-length coding of the differential value of the average height of each region.

Based on the result of decision or selection made by the selection unit 380, one of the processing of the first coding unit 101 and the processing of the second coding unit 201, which are a plurality of types of coding processing in the frequency domain, is performed.

<First Coding Unit 101>

The first coding unit 101 includes the linear prediction analysis coding unit 120, the spectral envelope coefficient sequence generating unit 130, the envelope normalization unit 140, and the normalized coefficient coding unit 150. To the first coding unit 101, the MDCT coefficient sequence $X_f(n)$ (n=1, ..., N) and the input sound signal $x_f(n)$ (n=1, ..., Nt) of the present frame are input, and a first code containing a linear prediction coefficient code $CL_f$ and a normalized coefficient code $CN_f$ is output therefrom. The output first code is input to the decoding device 400. Incidentally, the first coding unit 101 is what is obtained by removing, from the coding processing described in Non-patent Literature 1, a portion converting an input sound signal into a coefficient sequence in the frequency domain. That is, the coding processing which is performed in the frequency domain conversion unit 110 and the first coding unit 101 is similar to the coding processing described in Non-patent Literature 1.

<Linear Prediction Analysis Coding Unit 120>

The linear prediction analysis coding unit 120 obtains coefficients which are convertible into linear prediction coefficients by performing linear prediction analysis on the input sound signal $x_f(n)$ (n=1, ..., Nt), and obtains a linear prediction coefficient code $CL_f$ and coefficients which are convertible into quantized linear prediction coefficients corresponding to the linear prediction coefficient code $CL_f$ by coding the coefficients which are convertible into linear prediction coefficients and outputs the linear prediction coefficient code $CL_f$ and the coefficients (Step S120). The coefficients which are convertible into linear prediction coefficients are linear prediction coefficients themselves, PARCOR coefficients (partial autocorrelation coefficients), LSP parameters, or the like.

<Spectral Envelope Coefficient Sequence Generating Unit 130>

The spectral envelope coefficient sequence generating unit 130 obtains a power spectral envelope coefficient sequence $W_f(n)$ (n=1, ..., N) corresponding to the coefficients which are convertible into the quantized linear prediction coefficients obtained by the linear prediction analysis coding unit 120 and outputs the power spectral envelope coefficient sequence $W_f(n)$ (n=1, ..., N) (Step S130).

<Envelope Normalization Unit 140>

The envelope normalization unit 140 normalizes each coefficient $X_f(n)$ (n=1, ..., N) of the MDCT coefficient sequence obtained by the frequency domain conversion unit 110 by using the power spectral envelope coefficient sequence $W_f(n)$ (n=1, ..., N) obtained by the spectral envelope coefficient sequence generating unit 130 and outputs a normalized MDCT coefficient sequence $XN_f(n)$ (n=1, ..., N) (Step S140). That is, the envelope normalization unit 140 obtains, as the normalized MDCT coefficient sequence $XN_f(n)$ (n=1, ..., N), a series formed of values obtained by dividing each coefficient of the MDCT coefficient sequence $X_f(n)$ (n=1, ..., N) by a corresponding coefficient contained in the power spectral envelope coefficient sequence $W_f(n)$ (n=1, ..., N).

<Normalized Coefficient Coding Unit 150>

The normalized coefficient coding unit 150 obtains the normalized coefficient code $CN_f$ by coding the normalized MDCT coefficient sequence $XN_f(n)$ (n=1, ..., N) obtained by the envelope normalization unit 140 (Step S150).

<Second Coding Unit 201>

Moreover, the second coding unit 201 includes the region division unit 220, the average logarithmic energy differential variable-length coding unit 240, and the coefficient coding unit 250. To the second coding unit 201, the MDCT coefficient sequence $X_f(n)$ (n=1, ..., N) of the present frame is input, and a second code containing an average energy code $CA_f$ and a coefficient code $CD_f$ is output therefrom. The output second code is input to the decoding device 400. Incidentally, the second coding unit 201 is what is obtained by removing, from the coding processing described in Non-patent Literature 2, a portion converting an input sound signal into a coefficient sequence in the frequency domain. That is, the coding processing which is performed in the frequency domain conversion unit 110 and the second coding unit 201 is similar to the coding processing described in Non-patent Literature 2.

<Region Division Unit 220>

The region division unit 220 divides the MDCT coefficient sequence $X_f(n)$ (n=1, ..., N) obtained by the frequency domain conversion unit 110 into a plurality of partial regions such that the lower the frequencies of the partial regions are, the smaller the number of samples of the partial regions becomes; the higher the frequencies of the partial regions are, the greater the number of samples of the partial regions becomes (Step S220). If the number of partial regions is assumed to be R and the numbers of samples contained in the partial regions are assumed to be $S_1, \ldots, S_R$, each coefficient $X_f(n)$ ($n=1, \ldots, N$) of the MDCT coefficient sequence is divided into partial regions from the sample at the lowest frequency in order as follows: $XB_f(1)(n)$ ($n=1, \ldots, XB_f(2)(n)$ ($n=1, \ldots, S_2$), $\ldots, XB_f(R)(n)$ ($n=1, \ldots, S_R$). R and $S_1, \ldots, S_R$ are positive integers. It is assumed that $S_1, \ldots, S_R$ satisfy the relationship $S_1 \leq S_2 \leq \ldots \leq S_R$. $XB_f(1)(n)$ ($n=1, \ldots, S_1$), $XB_f(2)(n)$ ($n=1, \ldots, S_2$), $\ldots, XB_f(R)(n)$ ($n=1, \ldots, S_R$) is referred to as a partial region coefficient sequence.

<Average Logarithmic Energy Differential Variable-Length Coding Unit 240>

The average logarithmic energy differential variable-length coding unit 240 obtains, for each partial region obtained by the region division unit 220, the average energy of coefficients contained in the partial region, quantizes each average energy of the partial region on the logarithmic axes, performs variable-length coding on a difference in the quantization value of the average energy on the logarithmic axes between the adjacent partial regions, and obtains an average energy code $CA_f$ (Step S240).

The average logarithmic energy differential variable-length coding unit 240 first obtains the average energy $E_{XB}(r)$ ($r=1, \ldots, R$) of each partial region $r$ ($r=1, \ldots, R$) by formula (5) (Step S2401).

$$E_{XB}(r) = \frac{\sum_{n=1}^{S_r}(XB_f(r)(n))^2}{S_r} \tag{5}$$

The average logarithmic energy differential variable-length coding unit 240 then performs scalar quantization of the average energy $E_{XB}(r)$ ($r=1, \ldots, R$) in the log domain for each partial region and obtains a quantization value $Q(\log(E_{XB}(r)))$ ($r=1, \ldots, R$) of the average energy in the log domain (Step S2402). The average logarithmic energy differential variable-length coding unit 240 then obtains, for each partial region, a difference $\text{Diff}E_{XB}(r)$ between the quantization value $Q(\log(E_{XB}(r)))$ of the average energy in the log domain and the quantization value $Q(\log(E_{XB}(r-1)))$ of the average energy in the log domain, the average energy of the coefficients contained in an adjacent partial region (Step S2403). However, when $r=1$, the scalar quantization value $Q(\log(E_{XB}(r)))$ itself of the logarithmic value of the average energy $E_{XB}(1)$ is used as $\text{Diff}E_{XB}(1)$. $\text{Diff}E_{XB}(r)$ ($r=1, \ldots, R$) is referred to as an average logarithmic energy differential. That is, $\text{Diff}E_{XB}(r)=1, \ldots, R)$ is obtained by formula (6). However, $Q(\ )$ is assumed to be a scalar quantization function and is assumed to be a function that outputs an integer value which is obtained by rounding off a decimal fraction of a value obtained by normalizing (dividing) an input by a predetermined value.

$$\text{Diff}E_{XB}(r)=Q(\log(E_{XB}(r)))-Q(\log(E_{XB}(r-1)))(r \geq 2)$$

$$\text{Diff}E_{XB}(1)=Q(\log(E_{XB}(1))) \tag{6}$$

The average logarithmic energy differential variable-length coding unit 240 obtains an average energy code $CA_f$ by performing variable-length coding on the average logarithmic energy differential $\text{Diff}E_{XB}(r)$ ($r=1, \ldots, R$) (Step S2404). Incidentally, since the statistical frequency of appearance is high when the absolute value of the average logarithmic energy differential $\text{Diff}E_{XB}(r)$ is small, the variable-length code is determined in advance such that the code amount becomes smaller than that in a case where the absolute value is large. That is, when fluctuations in the average logarithmic energy in each region are small, that is, the ascents and descents of a spectral envelope are gentle, there is a tendency to be capable of shortening the length of the code of the average energy code $CA_f$ if the degree of concentration of the spectral envelope is low.

<Coefficient Coding Unit 250>

The coefficient coding unit 250 obtains a coefficient code $CD_f$ by performing, for example, scalar quantization on each coefficient of the partial region coefficient sequence $XB_f(1)(n)$ ($n=1, \ldots, S_1$), $XB_f(2)(n)$ ($n=1, \ldots, S_2$), $\ldots, XB_f(R)(n=1, \ldots, S_R)$ obtained by the region division unit 220 by using the quantization value $Q(\log(E_{XB}(r)))$ ($r=1, \ldots, R$) of the average energy in the log domain obtained by the average logarithmic energy differential variable-length coding unit 240 (Step S250). The quantization step width and the quantization bit number which are used for this scalar quantization are determined from the quantization value $Q(E_{XB}(r))$ ($r=1, \ldots, R$) of the average energy for each partial region coefficient sequence $XB_f(1)(n)$ ($n=1, \ldots, S_1$), $XB_f(2)(n)=1, \ldots, S_2$), $\ldots, XB_f(R)(n)$ ($n=1, \ldots, S_R$) obtained by the region division unit 220. Incidentally, the quantization value $Q(E_{XB}(r))$ ($r=1, \ldots, R$) of the average energy is obtained by converting the quantization value $Q(\log(E_{XB}(r)))$ ($r=1, \ldots, R$) of the average energy in the log domain into a value in the linear domain by formula (7).

$$Q(E_{XB}(r))=e^{Q(\log(E_{XB}(r)))} \tag{7}$$

The coefficient coding unit 250 first distributes the bit number given as the code amount of the coefficient code $CD_f$ to the coefficients of each partial region coefficient sequence with consideration given to the quantization value $Q(\log(E_{XB}(r)))$ ($r=1, \ldots, R$) of the average energy in the log domain corresponding to each region and a value of a difference between that value and the logarithmic value of energy at an auditorily indiscernible spectral level which is estimated by the frequency (Step S2501).

The coefficient coding unit 250 then determines the step width of scalar quantization of each coefficient of each partial region coefficient sequence from the quantization value $Q(E_{XB}(r))$ ($r=1, \ldots, R$) of the average energy of each partial region and the distributed bit number (Step S2502).

The coefficient coding unit 250 then obtains a coefficient code $CD_f$ by quantizing each coefficient of each partial region coefficient sequence by the step width thus determined and the bit number and performing variable-length coding on the integer value of each quantized coefficient (Step S2503).

<Decoding Device 400>

Figure 2:
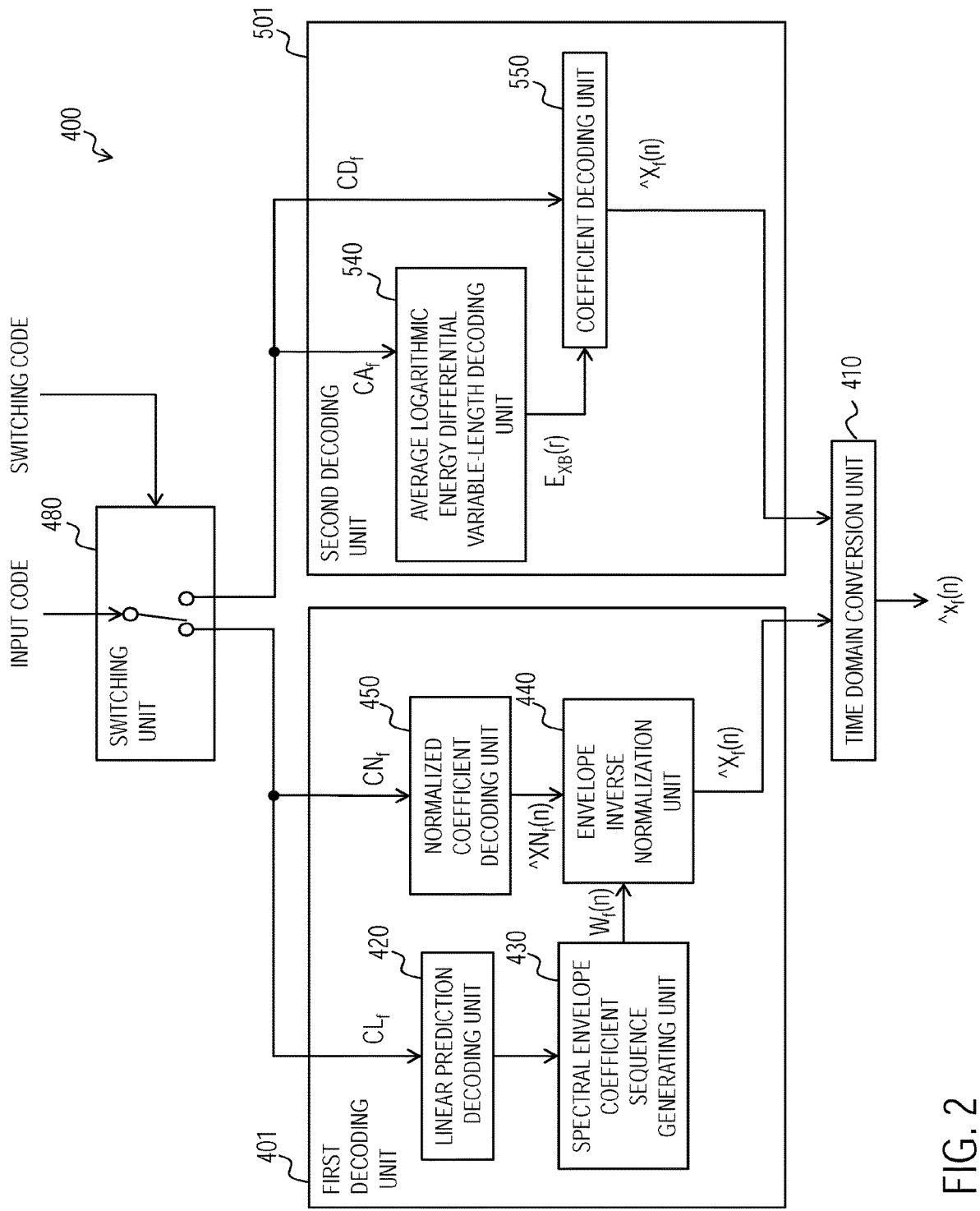
FIG. 2 is a block diagram illustrating the configuration of a decoding device.

The configuration of the decoding device 400 is depicted in FIG. 2. The decoding device 400 includes a switching unit 480, a first decoding unit 401, and a second decoding unit 501. The first decoding unit 401 includes, for example, a linear prediction decoding unit 420, a spectral envelope coefficient sequence generating unit 430, a normalized coefficient decoding unit 450, and an envelope inverse normalization unit 440. The second decoding unit 501 includes, for example, an average logarithmic energy differential variable-length decoding unit 540 and a coefficient decoding unit 550. To the decoding device 400, a code containing a switching code and an input code is input frame by frame which is a predetermined time segment. In the case of the frame coded in the first coding unit 101, the input code contains the linear prediction coefficient code $CL_f$ and the normalized coefficient code $CN_f$ in the case of the frame coded in the second coding unit 201, the input code contains the average energy code $CA_f$ and the coefficient code $CD_f$. Hereinafter, specific processing of each unit will be described based on the premise that the frame which is currently being processed is an f-th frame.

Hereinafter, the operation of the decoding device 400 will be described.

<Switching Unit 480>

The switching unit 480 selects whether to decode the input code of the present frame in the first decoding unit 401 or in the second decoding unit 501 based on the input switching code and performs control in such a way as to input the input code to the first decoding unit 401 or the second decoding unit 501 such that the selected decoding processing is performed (Step S480).

Specifically, if the input switching code is a code specifying the coding processing of the first coding unit 101, that is, a code specifying the coding processing using a spectral envelope based on coefficients which are convertible into linear prediction coefficients, the switching unit 480 performs control in such a way as to input the input code to the first decoding unit 401 that performs decoding processing corresponding to the coding processing of the first coding unit 101. Moreover, if the input switching code is a code specifying the coding processing of the second coding unit 201, that is, a code specifying the coding processing involving variable-length coding which is performed on a differential between the average energy of coefficients in each frequency domain obtained by division and the average energy of an adjacent frequency domain, the switching unit 480 performs control in such a way as to input the input code to the second decoding unit 501 that performs decoding processing corresponding to the coding processing of the second coding unit 201.

<First Decoding Unit 401>

The first decoding unit 401 includes the linear prediction decoding unit 420, the spectral envelope coefficient sequence generating unit 430, the normalized coefficient decoding unit 450, and the envelope inverse normalization unit 440. To the first decoding unit 401, the linear prediction coefficient code $CL_f$ and the normalized coefficient code $CN_f$ of the present frame are input, and a coefficient sequence $X_f(n)$ (n=1, . . . , N) in the frequency domain is output therefrom.

<Linear Prediction Decoding Unit 420>

The linear prediction decoding unit 420 obtains coefficients which are convertible into decoded linear prediction coefficients by decoding the linear prediction coefficient code $CL_f$ contained in the input code. The coefficients which are convertible into decoded linear prediction coefficients are the same as the coefficients which are convertible into the quantized linear prediction coefficients obtained by the linear prediction analysis coding unit 120 of the coding device 300. Moreover, the decoding processing which is performed by the linear prediction decoding unit 420 corresponds to the coding processing which is performed by the linear prediction analysis coding unit 120 of the coding device 300. Incidentally, the coefficients which are convertible into linear prediction coefficients are linear prediction coefficients themselves, PARCOR coefficients (partial auto-correlation coefficients), LSP parameters, or the like.

<Spectral Envelope Coefficient Sequence Generating Unit 430>

The spectral envelope coefficient sequence generating unit 430 obtains a power spectral envelope coefficient sequence $W_f(n)$ (n=1, . . . , N) corresponding to the coefficients obtained by the linear prediction decoding unit 420, which are convertible into decoded linear prediction coefficients, and outputs the power spectral envelope coefficient sequence $W_f(n)$ (n=1, . . . , N). However, N is a sample number in the frequency domain and is a positive integer.

<Normalized Coefficient Decoding Unit 450>

The normalized coefficient decoding unit 450 obtains a decoded normalized MDCT coefficient sequence $\hat{XN}_f(n)$ (n=1, . . . , N) by decoding the input normalized coefficient code $CN_f$ (Step S450). Here, the decoding processing which is performed by the normalized coefficient decoding unit 450 corresponds to the coding processing which is performed by the normalized coefficient coding unit 150 of the coding device 300. That is, if the conversion processing into the frequency domain which is not MDCT is performed in the coding device 300, $\hat{XN}_f(n)$ (n=1, . . . , N) is a coefficient sequence in the frequency domain, which is not MDCT, corresponding to the conversion processing into the frequency domain performed in the coding device 300. Incidentally, although the decoded normalized MDCT coefficient sequence $\hat{XN}_f(n)$ (n=1, . . . , N) corresponds to the normalized MDCT coefficient sequence $XN_f(n)$ (n=1, . . . , N) input to the normalized coefficient coding unit 150 of the coding device 300, since a quantization error is contained in each coefficient, $\hat{XN}_f(n)$ obtained by adding "^" to $XN_f(n)$ is used.

<Envelope Inverse Normalization Unit 440>

The envelope inverse normalization unit 440 performs inverse normalization on each coefficient $\hat{XN}_f(n)$ (n=1, . . . , N) of the decoded normalized MDCT coefficient sequence obtained by the normalized coefficient decoding unit 450 by using the power spectral envelope coefficient sequence $W_f(n)$ (n=1, . . . , N) obtained by the spectral envelope coefficient sequence generating unit 430, and outputs a decoded MDCT coefficient sequence $\hat{XN}_f(n)$ (n=1, . . . , N) (Step S440). That is, the envelope inverse normalization unit 440 obtains a series formed of values obtained by multiplying corresponding coefficients of the coefficients of the decoded normalized MDCT coefficient sequence $XN_f(n)$ (n=1, . . . , N) and the coefficients of the power spectral envelope coefficient sequence $W_f(n)$ (n=1, . . . , N) as the decoded MDCT coefficient sequence $\hat{X}_f(n)$ (n=1, . . . , N).

<Second Decoding Unit 501>

The second decoding unit 501 includes the average logarithmic energy differential variable-length decoding unit 540 and the coefficient decoding unit 550. To the second decoding unit 501, the average energy code $CA_f$ and the coefficient code $CD_f$ of the present frame are input, and a coefficient sequence $X_f(n)$ (n=1, . . . , N) in the frequency domain is output therefrom.

<Average Logarithmic Energy Differential Variable-Length Decoding Unit 540>

The average logarithmic energy differential variable-length decoding unit 540 obtains a decoded average energy $Q(E_{XB}(r))$ (r=1, . . . , R) in a partial region by decoding the input average energy code $CA_f$ (Step S540). Incidentally, since the decoded average energy is the same as the quantization value of the average energy obtained in the coefficient coding unit 250 of the coding device 300, the same symbol $Q(E_{XB}(r))$ is used.

The average logarithmic energy differential variable-length decoding unit 540 first obtains a difference $DiffE_{XB}(r)$=1, . . . , R) in energy in the log domain of each partial region by decoding the average energy code $CA_f$ (Step S5401). Here, the decoding processing which is performed by the average logarithmic energy differential variable-length decoding unit 540 corresponds to the coding processing which is performed by the average logarithmic energy differential variable-length coding unit 240 of the coding device 300. Incidentally, since a difference in energy in the log domain of each partial region is the same as a difference in energy in the log domain of each partial region which is obtained in the average logarithmic energy differential variable-length coding unit 240 of the coding device 300, the same symbol DiffE$_{XB}$(r) is used.

The average logarithmic energy differential variable-length decoding unit 540 then obtains, for each partial region, a decoded value Q(log(E$_{XB}$(r))) of the average energy in the log domain by adding the difference DiffE$_{XB}$(r) (r=1, . . . , R) in energy in the log domain to a decoded value Q(log(E$_{XB}$(r−1))) of the average energy in the log domain of an adjacent partial region (Step S5402). Incidentally, since the decoded value of the average energy in the log domain is the same as the quantization value of the average energy in the log domain which is obtained in the average logarithmic energy differential variable-length coding unit 240 of the coding device 300, the same symbol Q(log(E$_{XB}$(r))) is used.

$$Q(\log(E_{XB}(1))) = \text{Diff}E_{XB}(1)$$

$$Q(\log(E_{XB}(r))) = \text{Diff}E_{XB}(r) + Q(\log(E_{XB}(r-1))) (r \geq 2) \quad (8)$$

The average logarithmic energy differential variable-length decoding unit 540 then obtains what has the decoded value Q(log(E$_{XB}$(r−1))) (r=1, . . . , R) of the average energy in the log domain as a value in the linear domain as decoded average energy Q(E$_{XB}$(r)) (r=1, . . . , R) (Step S5403).

<Coefficient Decoding Unit 550>

The coefficient decoding unit 550 obtains a decoded coefficient sequence ^X$_f$(n) (n=1, . . . , N) by decoding the coefficient code CD$_f$ by using the decoded average energy Q(E$_{XB}$(r)) (r=1, . . . , R) obtained in the average logarithmic energy differential variable-length decoding unit 540 (Step S550). Here, the decoding processing which is performed by the coefficient decoding unit 550 corresponds to the coding processing which is performed by the coefficient coding unit 250 of the coding device 300. Since the input coefficient code CD$_f$ is what was obtained by performing variable-length coding on each coefficient of each partial region coefficient sequence in the coefficient coding unit 250 of the coding device 300, the code length of a code portion of the coefficient code CD$_f$ corresponding to each coefficient can be automatically reconstituted. Moreover, the quantization step width of each region is obtained from the decoded average energy Q(E$_{XB}$(r)) obtained in the average logarithmic energy differential variable-length decoding unit 540. As a result, it is possible to obtain the decoded MDCT coefficient sequence ^X$_f$(n) (n=1, . . . , N) in the frequency domain from the coefficient code CD$_f$.

<Time Domain Conversion Unit 410>

The time domain conversion unit 410 obtains a decoded sound signal ^X$_f$(n) (n=1, . . . , Nt) by converting a decoded MDCT coefficient sequence ^X$_f$(n) (n=1, . . . , N) at point N into the time domain and outputs the decoded sound signal ^X$_f$(n) (n=1, . . . , Nt) (Step S410). However, Nt is a sample number in the time domain and is a positive integer. If conversion into the frequency domain which is not MDCT is performed in the frequency domain conversion unit 110 of the coding device 300, it is necessary simply to perform conversion processing into the time domain corresponding to that conversion processing.

According to the first embodiment, since switching of coding processing and decoding processing can be performed only when the high frequency energy of an input sound signal is small, even when a plurality of types of coding processing and decoding processing which are different in the quantization characteristics of high frequency components are installed, it is possible to obtain a decoded sound signal that sounds less artificial to a listener.

According to the first embodiment, moreover, since it is possible to select coding processing suitable for an input sound signal, without performing actual coding, from coding processing using a spectral envelope based on coefficients which are convertible into linear prediction coefficients and coding processing using the average energy of coefficients in each frequency domain obtained by division, it is possible to perform coding processing suitable for an input sound signal with a small arithmetic processing amount.

According to the first embodiment, furthermore, since it is possible to perform coding by selecting coding processing from coding processing using a spectral envelope based on coefficients which are convertible into linear prediction coefficients and coding processing using the average energy of coefficients in each frequency domain obtained by division, irrespective of whether or not the ascents and descents of a spectrum of an input sound signal are steep and whether or not the degree of concentration of the spectrum is high, it is possible to perform efficient coding processing regardless of the characteristics of the input sound signal.

Second Embodiment

In the first embodiment, a coefficient sequence in the frequency domain of the present frame is always coded by the same coding processing as the coding processing of the preceding frame when the magnitude of the energy of high frequency components of an input sound signal is great; a second embodiment allows a coefficient sequence in the frequency domain of the present frame to be coded by coding processing which is different from the coding processing of the preceding frame depending on the state in which high frequency components of an input sound signal are sparse even when the magnitude of the energy of the high frequency components of the input sound signal is great.

A coding device of the second embodiment makes it possible to select coding processing which is different from the coding processing of the preceding frame as coding processing of the present frame if the energy of high frequency components of an input sound signal is small; otherwise, in accordance with the state in which the high frequency components of the input sound signal are sparse, the coding device selects whether to make it possible to select coding processing which is different from the coding processing of the preceding frame as coding processing of the present frame or select the same coding processing as the coding processing of the preceding frame as coding processing of the present frame.

The configuration of the coding device of the second embodiment is FIG. 1, which is the same as the first embodiment. A coding device 300 of the second embodiment is the same as the coding device 300 of the first embodiment except that processing of the switching permission judgment unit 381 and the switching selection unit 383 in the selection unit 380 is different from that of the coding device 300 of the first embodiment. The configuration of a decoding device of the second embodiment is FIG. 2, which is the same as the first embodiment, and processing of each unit is also the same as that of the decoding device of the first embodiment. Hereinafter, the switching permission judgment unit 381 and the switching selection unit 383 in the selection unit 380, which perform processing different from the processing performed in the coding device 300 of the first embodiment, will be described.

<Switching Permission Judgment Unit 381>

The switching permission judgment unit 381 judges that, if at least one of the magnitude of the energy of high frequency components of the input sound signal of the preceding frame and the magnitude of the energy of high frequency components of the input sound signal of the present frame is smaller than a predetermined threshold value, switching is permitted, that is, judges that the switching permission judgment unit 381 makes it possible to code a coefficient sequence in the frequency domain of the present frame by coding processing which is different from the coding processing by which the coefficient sequence in the frequency domain of the preceding frame was coded, and outputs the judgment result (Step S381). Otherwise, the switching permission judgment unit 381 does not make any judgment such as switching is permitted or switching is not permitted, and outputs information indicating that any judgment such as switching is permitted or switching is not permitted has not been made as the judgment result, or does not output any judgment result. As the magnitude of the energy of high frequency components of an input sound signal, as is the case with the first embodiment, high frequency energy may be used or the ratio of high frequency energy to the total energy may be used.

<Switching Selection Unit 383>

The switching selection unit 383 selects whether the coefficient sequence in the frequency domain of the present frame is coded in the first coding unit 101 or in the second coding unit 201 based on the information on whether or not switching is permitted that was obtained by the switching permission judgment unit 381, the information on which coding processing is suitable that was obtained by the suitable coding processing judgment unit 382, and the state, which is obtained from the input sound signal, indicating whether or not the high frequency components of the input sound signal are sparse, and outputs a switching code that is a code by which the selected coding processing can be identified (Step S383B). The output switching code is input to the decoding device 400.

If the information on whether or not switching is permitted that was obtained by the switching permission judgment unit 381 indicates that switching is permitted, that is, the energy of high frequency components of the input sound signal is small, the switching selection unit 383 performs the same processing as the switching selection unit 383 of the first embodiment. If the information on whether or not switching is permitted that was obtained by the switching permission judgment unit 381 indicates that any judgment such as switching is permitted or switching is not permitted has not been made or the judgment result is not input to the switching permission judgment unit 381, that is, if the energy of high frequency components of the input sound signal is great, the switching selection unit 383 selects whether or not to allow the coefficient sequence in the frequency domain of the present frame to be coded by coding processing which is different from the coding processing of the preceding frame based on the state, which is obtained from the input sound signal, indicating whether or not the high frequency components of the input sound signal are sparse.

Figure 6:
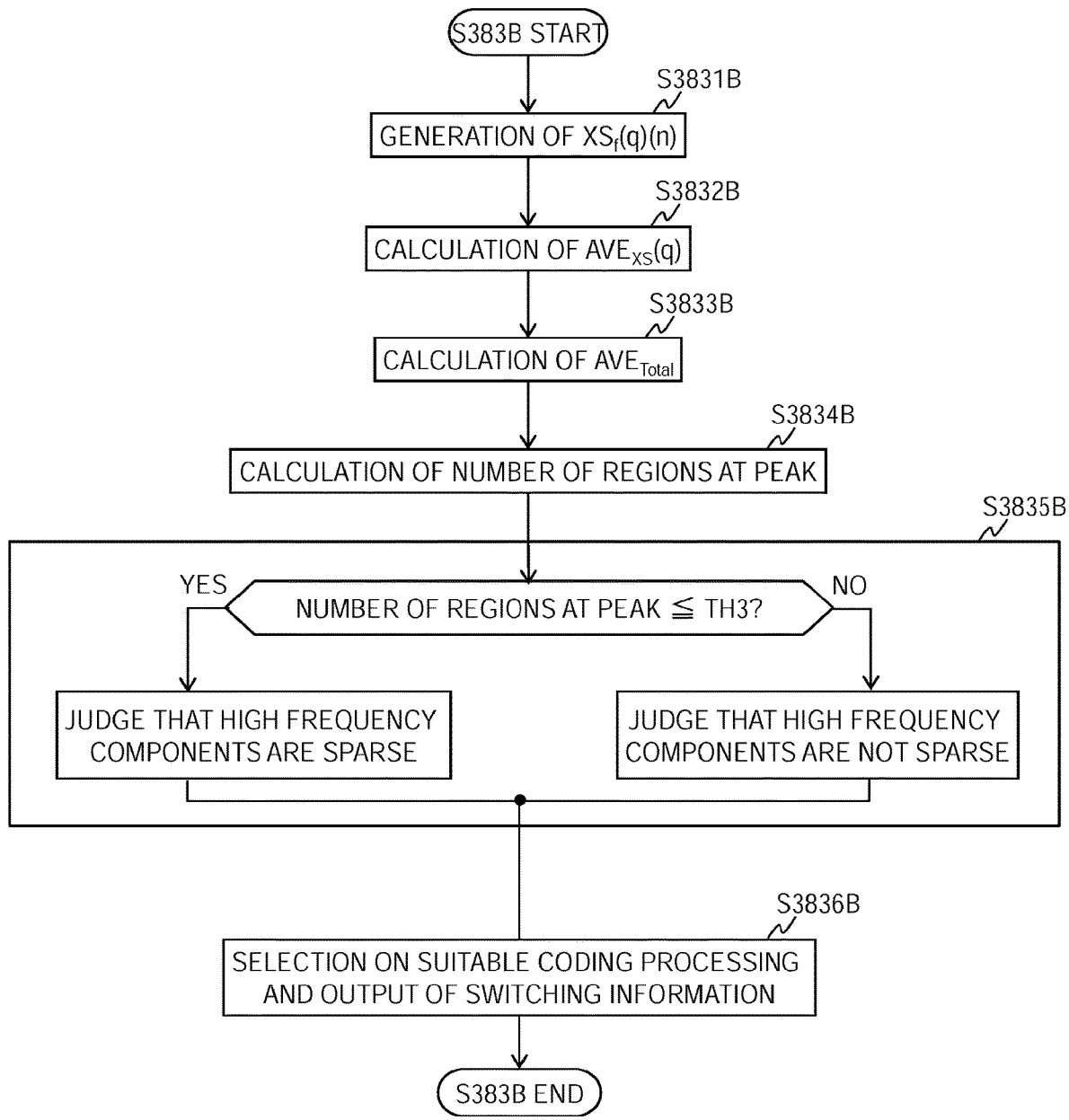
FIG. 6 is a diagram depicting an example of the flow of processing of a switching selection unit 383 of a second embodiment.

Hereinafter, of the operation of the switching selection unit 383, a difference from the operation of the switching selection unit 383 of the first embodiment, that is, an example of the operation of the switching selection unit 383 when the energy of the high frequency components of the input sound signal is great will be described. In the following example, as is the case with the first embodiment, the coding processing of the first coding unit 101 is coding processing using a spectral envelope based on coefficients which are convertible into linear prediction coefficients, which is illustrated in Non-patent Literature 1, and the coding processing of the second coding unit 201 is coding processing involving variable-length coding which is performed on a differential between the logarithmic value of the average energy of coefficients in each frequency domain obtained by division and the logarithmic value of the average energy of an adjacent frequency domain, which is illustrated in Non-patent Literature 2. The switching selection unit 383 performs processing from Steps S3831B to S3836B of FIG. 6, for example.

The switching selection unit 383 first divides the MDCT coefficient sequence $X_f(n)$ (n=1, ..., N) of the present frame into Q partial coefficient sequences $XS_f(1)(n)$ (n=1, ..., P), $XS_f(2)(n)$ (n=1, ..., P), ..., $XS_f(Q)(n)$ (n=1, ..., P), each having P samples (Step S3831B). P and Q are positive integers that satisfy the relationship P×Q=N. P may be 1. Moreover, here, a configuration in which the MDCT coefficient sequence $X_f(n)$ (n=1, ..., N) which is a coefficient sequence in the frequency domain that is to be subjected to coding processing in the first coding unit 101 or in the second coding unit 201 is also used in the switching selection unit 383 is adopted, but a coefficient sequence in the frequency domain obtained by conversion into the frequency domain at a different degree of accuracy and by a different method from those adopted for the MDCT coefficient sequence $X_f(n)$ (n=1, ..., N), for example, a power spectral series may be used as an object on which processing by the switching selection unit 383 is to be performed.

The switching selection unit 383 then obtains a series $AVE_{XS}(q)$ (q=1, ..., Q) formed of the logarithmic value of the mean value of power of each of the partial coefficient sequences $XS_f(1)(n)$ (n=1, ..., P), $XS_f(2)(n)$ (n=1, ..., P), $XS_f(Q)(n)$ (n=1, ..., P) (Step S3832B). The logarithmic value of the mean value of power of each partial coefficient sequence is $AVE_{XS}(q)$ which is obtained by formula (3A).

Moreover, the switching selection unit 383 obtains the logarithmic value of the mean value of power of the MDCT coefficient sequence $X_f(n)$ (n=1, ..., N) (Step S3833B). The logarithmic value of the mean value of power of the MDCT coefficient sequence is $AVE_{Total}$ which is obtained by formula (9).

$$AVE_{Total} = \log\left(\frac{\sum_{n=1}^{N}(X_f(n))^2}{N}\right) \quad (9)$$

The switching selection unit 383 then obtains the number of $AVE_{XS}(q)$ in which q satisfies formula (10) within the previously set range of $Q_{Low}$ ($1 < Q_{Low}$) to $Q_{High}$ ($Q_{Low} \leq Q_{High} \leq Q$), that is, the predetermined range of one or more than one partial region located on the high frequency side, in other words, the number of regions at the peak (Step S3834B). μ and λ are positive constants.

$$AVE_{XS}(q) \geq \mu \cdot AVE_{Total} \lambda \quad (10)$$

The switching selection unit 383 then judges that the high frequency components of the input sound signal of the present frame are sparse if the number of regions at the peak is smaller than or equal to a threshold value TH3 and judges that the high frequency components of the input sound signal of the present frame are not sparse if the number of regions at the peak exceeds the threshold value TH3 (Step S3835B). Here, the threshold value TH3 is a value that is determined by a predetermined rule such that, if the high frequency components of the input sound signal of a past frame close to the present frame are sparse, the value becomes a value greater than a value which is set when the high frequency components of the input sound signal of the past frame close to the present frame are not sparse. For example, if the high frequency components of the input sound signal of the past frame close to the present frame are sparse, predetermined TH3_1 is used as the threshold value TH3; if the high frequency components of the input sound signal of the past frame close to the present frame are not sparse, predetermined TH3_2 which is a value smaller than TH3_1 is used as the threshold value TH3. Here, the past frame close to the present frame is, for example, the preceding frame or the frame before the preceding frame. The judgment result as to whether or not the high frequency components of the input sound signal of the present frame are sparse is stored in the switching selection unit 383 until the end of at least two frames after the present frame.

The switching selection unit 383 then selects to code the coefficient sequence in the frequency domain of the present frame in either the first coding unit 101 or the second coding unit 201 based on the coding processing of the preceding frame and the judgment result on the present frame and the past frame close to the present frame as to whether or not the high frequency components of the input sound signal are sparse (Step S3836B). That is, the switching selection unit 383 selects whether or not to allow the coefficient sequence in the frequency domain of the present frame to be coded by coding processing which is different from the coding processing of the preceding frame.

For example, when the MDCT coefficient sequence $X_{f-1}(n)$ (n=1, . . . , N) of the preceding frame was coded in the first coding unit 101, if the high frequency components of the present frame are not sparse and the high frequency components are sparse in at least one of the preceding frame and the frame before the preceding frame, the switching selection unit 383 makes it possible to select to code the MDCT coefficient sequence $X_f(n)$ (n=1, . . . , N) of the present frame in the second coding unit 201; otherwise, the switching selection unit 383 selects to code the MDCT coefficient sequence $X_f(n)$ (n=1, . . . , N) of the present frame in the first coding unit 101. That is, when the MDCT coefficient sequence $X_{f-1}(n)$ (n=1, . . . , N) of the preceding frame was coded in the first coding unit 101, if the high frequency components of the present frame are not sparse and the high frequency components are sparse in at least one of the preceding frame and the frame before the preceding frame, the switching selection unit 383 allows the coefficient sequence in the frequency domain of the present frame to be coded by coding processing which is different from the coding processing of the preceding frame; otherwise, the switching selection unit 383 does not allow the coefficient sequence in the frequency domain of the present frame to be coded by coding processing which is different from the coding processing of the preceding frame.

Moreover, when the MDCT coefficient sequence $X_{f-1}(n)$ (n=1, . . . , N) of the preceding frame was coded in the second coding unit 201, if (1) the high frequency components of the present frame are sparse and the high frequency components of the preceding frame are not sparse or (2) the high frequency components of the present frame are sparse, the high frequency components of the preceding frame are sparse, and the high frequency components of the frame before the preceding frame are not sparse, the switching selection unit 383 makes it possible to select to code the MDCT coefficient sequence $X_f(n)$ (n=1, . . . , N) of the present frame in the first coding unit 101; otherwise, the switching selection unit 383 selects to code the MDCT coefficient sequence $X_f(n)$ (n=1, . . . , N) of the present frame in the second coding unit 201. That is, when the MDCT coefficient sequence $X_{f-1}(n)$ (n=1, . . . , N) of the preceding frame was coded in the second coding unit 201, if (1) the high frequency components of the present frame are sparse and the high frequency components of the preceding frame are not sparse or (2) the high frequency components of the present frame are sparse, the high frequency components of the preceding frame are sparse, and the high frequency components of the frame before the preceding frame are not sparse, the switching selection unit 383 allows the coefficient sequence in the frequency domain of the present frame to be coded by coding processing which is different from the coding processing of the preceding frame; otherwise, the switching selection unit 383 does not allow the coefficient sequence in the frequency domain of the present frame to be coded by coding processing which is different from the coding processing of the preceding frame.

Incidentally, if the switching selection unit 383 allows the coefficient sequence in the frequency domain of the present frame to be coded by coding processing which is different from the coding processing of the preceding frame, the switching selection unit 383 selects the coding processing of the coefficient sequence in the frequency domain of the present frame based on the information on which coding processing is suitable that was obtained by the suitable coding processing judgment unit 382. For example, if the switching selection unit 383 allows the coefficient sequence in the frequency domain of the present frame to be coded by coding processing which is different from the coding processing of the preceding frame, even when the MDCT coefficient sequence $X_{f-1}(n)$ (n=1, . . . , N) of the preceding frame was coded in the second coding unit 201, if the information on which coding processing is suitable that was obtained by the suitable coding processing judgment unit 382 indicates the coding processing of the first coding unit 101, the switching selection unit 383 selects to code the MDCT coefficient sequence $X_f(n)$ (n=1, . . . , N) of the present frame in the first coding unit 101. Moreover, if the switching selection unit 383 allows the coefficient sequence in the frequency domain of the present frame to be coded by coding processing which is different from the coding processing of the preceding frame, even when the MDCT coefficient sequence $X_{f-1}(n)$ (n=1, . . . , N) of the preceding frame was coded in the first coding unit 101, if the information on which coding processing is suitable that was obtained by the suitable coding processing judgment unit 382 indicates the coding processing of the second coding unit 201, the switching selection unit 383 selects to code the MDCT coefficient sequence $X_f(n)$ (n=1, . . . , N) of the present frame in the second coding unit 201.

Incidentally, even when the switching selection unit 383 allows the coefficient sequence in the frequency domain of the present frame to be coded by coding processing which is different from the coding processing of the preceding frame, if it is judged that the coefficient sequence in the frequency domain of the present frame has to be coded by the same coding processing as the coding processing of the preceding frame based on the other information obtained by a means that is not depicted in the coding device 300, the coefficient sequence in the frequency domain corresponding to the input sound signal of the present frame may be coded by the same coding processing as the coding processing of the preceding frame.

Moreover, in Step S3831B, different sample numbers may be adopted for different partial coefficient sequences. For example, the MDCT coefficient sequence $X_f(n)$ (n=1, ..., N) of the present frame may be divided into Q partial coefficient sequences $XS_f(1)(n)$ (n=1, ..., $P_1$), $XS_f(2)(n)$ (n=1, ..., $P_2$), ..., $XS_f(Q)(n)$ (I)=1, ..., $P_1$, $P_2$, ..., $P_Q$ are positive integers that satisfy $P_1+P_2+P_Q=N$. Furthermore, it is preferable that $P_1, P_2, \ldots, P_Q$ satisfy $P_1 \leq P_2 \leq \ldots \leq P_Q$. Moreover, Q is a positive integer.

Furthermore, if the suitable coding processing judgment unit 382 performed the same processing as the processing in Step S3831B, Step S3832B, and Step S3833B, the switching selection unit 383 may use the result of the processing performed by the suitable coding processing judgment unit 382 without performing Step S3831B, Step S3832B, and Step S3833B.

Third Embodiment

In the first embodiment and the second embodiment, coding processing for which the present frame is suitable is judged by using one threshold value; in a third embodiment, a judgment using two threshold values is made.

The configuration of a coding device of the third embodiment is FIG. 1, which is the same as the first embodiment. A coding device 300 of the third embodiment is the same as the coding device 300 of the first embodiment or the second embodiment except that processing of the suitable coding processing judgment unit 382 and the switching selection unit 383 in the selection unit 380 is different from that of the coding device 300 of the first embodiment or the second embodiment. The configuration of a decoding device of the third embodiment is FIG. 2, which is the same as the first embodiment, and processing of each unit is also the same as that of the decoding device of the first embodiment. Hereinafter, the suitable coding processing judgment unit 382 and the switching selection unit 383 in the selection unit 380, which perform processing different from the processing performed in the coding device 300 of the first embodiment, will be described.

<Suitable Coding Processing Judgment Unit 382>

Figure 7:
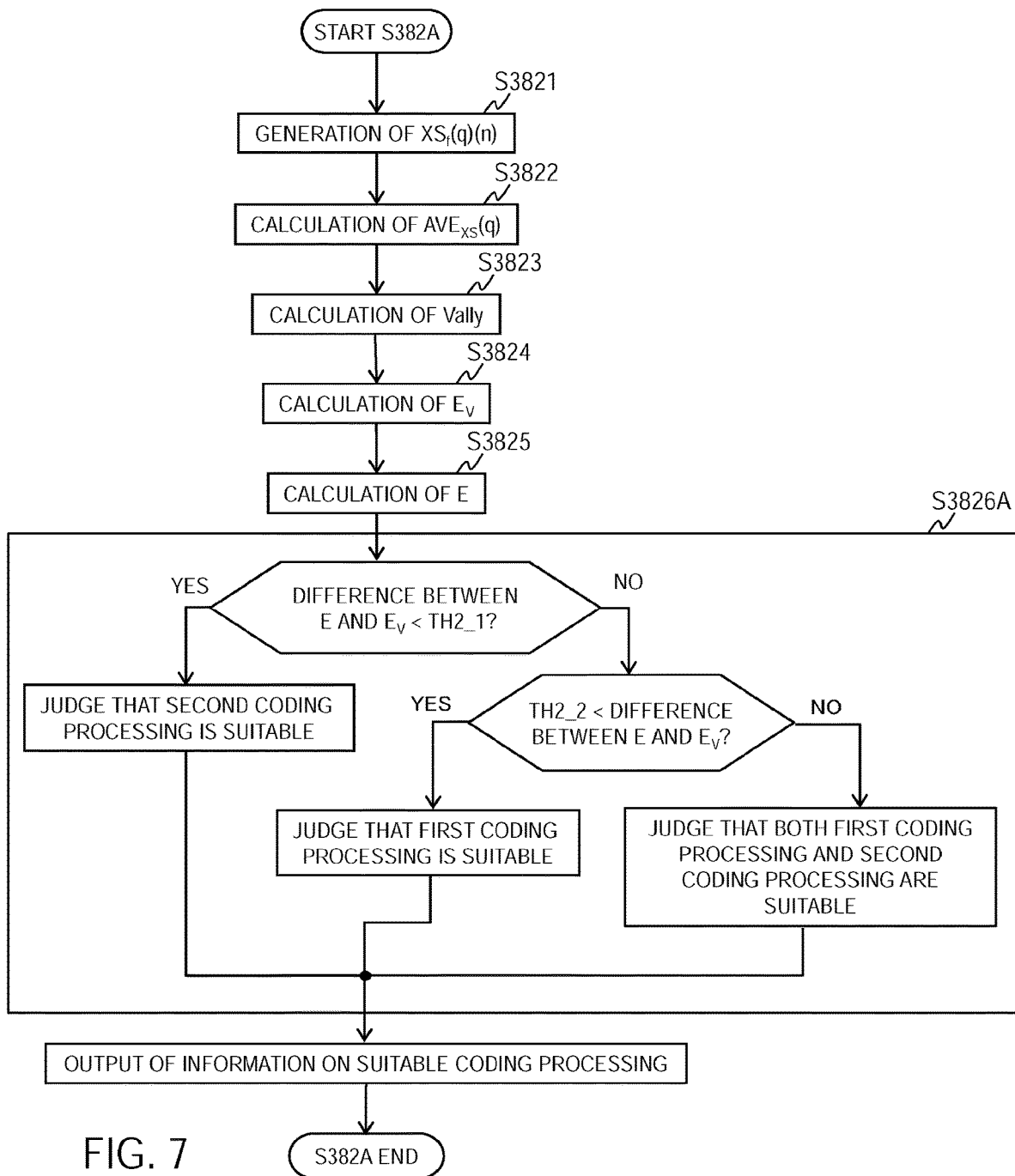
FIG. 7 is a diagram depicting an example of the flow of processing of a suitable coding processing judgment unit 382 of a third embodiment.

The suitable coding processing judgment unit 382 performs processing in each step illustrated in FIG. 7. The suitable coding processing judgment unit 382 judges whether the coefficient sequence in the frequency domain corresponding to the input sound signal of the present frame is suitable for the coding processing of the first coding unit 101 or the coding processing of the second coding unit 201, in other words, which coding processing may be performed, and outputs the judgment result (Step S382A).

Hereinafter, an example of the operation of the suitable coding processing judgment unit 382 will be described. The suitable coding processing judgment unit 382 performs processing in each step illustrated in FIG. 7. In the following example, the coding processing of the first coding unit 101 is coding processing using a spectral envelope based on coefficients which are convertible into linear prediction coefficients, which is illustrated in Non-patent Literature 1, and the coding processing of the second coding unit 201 is coding processing involving variable-length coding which is performed on a differential between the logarithmic value of the average energy of coefficients in each frequency domain obtained by division and the logarithmic value of the average energy of an adjacent frequency domain, which is illustrated in Non-patent Literature 2.

In this example, if the ascents and descents of a spectral envelope of an input sound signal are steep or/and the degree of concentration of the spectral envelope is high, the suitable coding processing judgment unit 382 judges that the coefficient sequence in the frequency domain corresponding to the input sound signal of the present frame is suitable for the coding processing of the first coding unit 101; if the ascents and descents of the spectral envelope of the input sound signal are gentle or/and the degree of concentration of the spectral envelope is low, the suitable coding processing judgment unit 382 judges that the coefficient sequence in the frequency domain corresponding to the input sound signal of the present frame is suitable for the coding processing of the second coding unit 201; if the ascents and descents of the spectral envelope of the input sound signal are moderate or/and the degree of concentration of the spectral envelope is medium, the suitable coding processing judgment unit 382 judges that either the coding processing of the first coding unit 101 or the coding processing of the second coding unit 201 may be performed on the coefficient sequence in the frequency domain corresponding to the input sound signal of the present frame, that is, the coefficient sequence in the frequency domain corresponding to the input sound signal of the present frame is suitable for both the coding processing of the first coding unit 101 and the coding processing of the second coding unit 201. The suitable coding processing judgment unit 382 then outputs the judgment result.

If the ascents and descents of the spectral envelope of the input sound signal are moderate or/and the degree of concentration of the spectral envelope is medium, as will be described later, the switching selection unit 383 selects to code the coefficient sequence in the frequency domain of the present frame by the same coding processing as the coding processing of the preceding frame. That is, in the switching selection unit 383, the coding processing of the present frame is selected such that switching of the coding processing between the preceding frame and the present frame does not give the listener a strong feeling of artificiality. Thus, a case where the ascents and descents of the spectral envelope of the input sound signal are moderate or/and the degree of concentration of the spectral envelope is medium may include not only a case where either the coding processing of the first coding unit 101 or the coding processing of the second coding unit 201 may be performed on the coefficient sequence in the frequency domain corresponding to the input sound signal of the present frame and a case where the coefficient sequence in the frequency domain corresponding to the input sound signal of the present frame is suitable for both the coding processing of the first coding unit 101 and the coding processing of the second coding unit 201, but also a case where it is difficult to say for which of the coding processing of the first coding unit 101 and the coding processing of the second coding unit 201 the coefficient sequence in the frequency domain corresponding to the input sound signal of the present frame is suitable and a case where there is a possibility that the coefficient sequence in the frequency domain corresponding to the input sound signal of the present frame is not suitable for both the coding processing of the first coding unit 101 and the coding processing of the second coding unit 201. That is, the above-described judgment "being suitable for both the coding processing of the first coding unit 101 and the coding processing of the second coding unit 201" may translate into a judgment "it is impossible to judge the suitability for the coding processing of the first coding unit 101 and the suitability for the coding processing of the second coding unit 201".

As a method of estimating the ascents and descents and the degree of concentration of a spectrum, any method may be adopted, and a configuration in which the depth of the valley of a spectral envelope is estimated will be described. In this configuration, if the valley of a spectral envelope is shallow, it is judged that the ascents and descents of a spectrum are gentle and the degree of concentration of the spectrum is low; if the valley of a spectral envelope is deep, it is judged that the ascents and descents of a spectrum are steep and the degree of concentration of the spectrum is high; if the depth of the valley of a spectral envelope is medium, it is judged that the ascents and descents of a spectrum are moderate and the degree of concentration of the spectrum is medium.

The suitable coding processing judgment unit 382 performs Steps S3821 to S3825 which are the same as those of the suitable coding processing judgment unit 382 of the first embodiment and Step S3826A which is different from the corresponding step of the suitable coding processing judgment unit 382 of the first embodiment. Hereinafter, a difference from the suitable coding processing judgment unit 382 of the first embodiment will be described.

After Step S3825, the suitable coding processing judgment unit 382 performs the following judgment processing using threshold values TH2_1 and TH2_2 and output of suitability information which will be described later (Step S3826A).

If a difference between the mean value E of $AVE_{XS}(q)$ of all the partial regions and the mean value $E_V$ of $AVE_{XS}(q)$ of the partial regions of the valley is smaller than a predetermined threshold value TH2_1, since it is estimated that the valley of a spectrum is shallow and the spectrum is a spectrum whose spectral envelope has gentle ascents and descents or whose degree of concentration is low, the suitable coding processing judgment unit 382 judges that the coefficient sequence in the frequency domain corresponding to the input sound signal of the present frame is suitable for the coding processing of the second coding unit 201.

Moreover, if a difference between the mean value E of $AVE_{XS}(q)$ of all the partial regions and the mean value $E_V$ of $AVE_{XS}(q)$ of the partial regions of the valley is greater than a predetermined threshold value TH2_2 which is a value greater than the threshold value TH2_1, since it is estimated that the valley of a spectrum is deep and the spectrum is a spectrum whose spectral envelope has steep ascents and descents or whose degree of concentration is high, the suitable coding processing judgment unit 382 judges that the coefficient sequence in the frequency domain corresponding to the input sound signal of the present frame is suitable for the coding processing of the first coding unit 101.

Furthermore, if a difference between the mean value E of $AVE_{XS}(q)$ of all the partial regions and the mean value $E_V$ of $AVE_{XS}(q)$ of the partial regions of the valley is greater than or equal to the threshold value TH2_1 but smaller than or equal to the threshold value TH2_2, since it is estimated that the depth of the valley of a spectrum is medium and the spectrum is a spectrum whose spectral envelope has moderate ascents and descents or whose degree of concentration is medium, the suitable coding processing judgment unit 382 may perform either the coding processing of the first coding unit 101 or the coding processing of the second coding unit 201 on the coefficient sequence in the frequency domain corresponding to the input sound signal of the present frame. That is, the suitable coding processing judgment unit 382 judges that the coefficient sequence in the frequency domain corresponding to the input sound signal of the present frame is suitable for both the coding processing of the first coding unit 101 and the coding processing of the second coding unit 201.

Then, the suitable coding processing judgment unit 382 outputs suitability information which is information on suitable coding processing. The suitability information is the judgment result of the suitable coding processing judgment unit 382 and it can be said that the suitability information is information on which of the coding processing of the first coding unit 101 and the coding processing of the second coding unit 201 is suitable or information as to whether or not both the coding processing of the first coding unit 101 and the coding processing of the second coding unit 201 are suitable.

Incidentally, the suitable coding processing judgment unit 382 may output information indicating that the coefficient sequence in the frequency domain corresponding to the input sound signal of the present frame is suitable for the coding processing of the first coding unit 101 or information indicating that the coefficient sequence in the frequency domain corresponding to the input sound signal of the present frame is suitable for the coding processing of the second coding unit 201 only when it is judged that the coefficient sequence in the frequency domain corresponding to the input sound signal of the present frame is suitable for any one of the coding processing of the first coding unit 101 and the coding processing of the second coding unit 201 and perform any one of the coding processing of the first coding unit 101 and the coding processing of the second coding unit 201 on the coefficient sequence in the frequency domain corresponding to the input sound signal of the present frame. That is, a configuration may be adopted in which the judgment result is not output if it is judged that the coefficient sequence in the frequency domain corresponding to the input sound signal of the present frame is suitable for both the coding processing of the first coding unit 101 and the coding processing of the second coding unit 201.

<Switching Selection Unit 383>

Based on the information on whether or not switching is permitted that was obtained by the switching permission judgment unit 381 and the information, which was obtained by the suitable coding processing judgment unit 382, on which of the coding processing of the first coding unit 101 and the coding processing of the second coding unit 201 is suitable or the information as to whether or not both the coding processing of the first coding unit 101 and the coding processing of the second coding unit 201 are suitable, that is, the information (suitability information) on suitable coding processing, the switching selection unit 383 selects whether to code the coefficient sequence in the frequency domain of the present frame in the first coding unit 101 or in the second coding unit 201 and outputs a switching code that is a code by which the selected coding processing can be identified (Step S383A). The output switching code is input to the decoding device 400. Here, if switching is not permitted, irrespective of the coding processing for which the present frame is suitable, the switching selection unit 383 selects to code the coefficient sequence in the frequency domain of the present frame by the same coding processing as the coding processing of the preceding frame. Moreover, if switching is permitted and the present frame is suitable for both the coding processing of the first coding unit 101 and the coding processing of the second coding unit 201, the switching selection unit 383 selects to code the coefficient sequence in the frequency domain of the present frame by the same coding processing as the coding processing of the preceding frame. Furthermore, if switching is permitted and the present frame is suitable for any one of the coding processing of the first coding unit 101 and the coding processing of the second coding unit 201, irrespective of the coding processing of the preceding frame, the switching selection unit 383 selects to code the coefficient sequence in the frequency domain of the present frame by the coding processing for which the present frame is suitable.

Hereinafter, an example of the operation of the switching selection unit 383 will be described. In the following example, the coding processing of the first coding unit 101 is coding processing using a spectral envelope based on coefficients which are convertible into linear prediction coefficients, which is illustrated in Non-patent Literature 1, and the coding processing of the second coding unit 201 is coding processing involving variable-length coding which is performed on a differential between the logarithmic value of the average energy of coefficients in each frequency domain obtained by division and the logarithmic value of the average energy of an adjacent frequency domain, which is illustrated in Non-patent Literature 2.

If the information on whether or not switching is permitted that was obtained by the switching permission judgment unit 381 indicates that switching is not permitted and/or the information (suitability information) on which coding processing is suitable that was obtained by the suitable coding processing judgment unit 382 indicates the same coding processing as the coding processing performed on the MDCT coefficient sequence $X_{f-1}(n)$ (n=1, . . . , N) of the preceding frame or indicates that both the coding processing of the first coding unit 101 and the coding processing of the second coding unit 201 are suitable, the switching selection unit 383 selects the same coding processing as the coding processing performed on the MDCT coefficient sequence $X_{f-1}(n)$ (n=1, . . . , N) of the preceding frame as the coding processing which is performed on the MDCT coefficient sequence $X_f(n)$ (n=1, . . . , N) of the present frame.

That is, if the MDCT coefficient sequence $X_{f-1}(n)$=1, . . . , N) of the preceding frame was coded in the first coding unit 101 and the information on whether or not switching is permitted that was obtained by the switching permission judgment unit 381 indicates that switching is not permitted, the switching selection unit 383 selects to code the MDCT coefficient sequence $X_f(n)$ (n=1, . . . , N) of the present frame also in the first coding unit 101. Moreover, if the MDCT coefficient sequence $X_{f-1}(n)$ (n=1, . . . , N) of the preceding frame was coded in the first coding unit 101 and the information (suitability information) on which coding processing is suitable that was obtained by the suitable coding processing judgment unit 382 indicates the coding processing of the first coding unit 101, the switching selection unit 383 selects to code the MDCT coefficient sequence $X_f(n)$ (n=1, . . . , N) of the present frame also in the first coding unit 101. Furthermore, if the MDCT coefficient sequence $X_{f-1}(n)$ (n=1, . . . , N) of the preceding frame was coded in the first coding unit 101 and the information (suitability information) on which coding processing is suitable that was obtained by the suitable coding processing judgment unit 382 indicates that both the coding processing of the first coding unit 101 and the coding processing of the second coding unit 201 are suitable, the switching selection unit 383 selects to code the MDCT coefficient sequence $X_f(n)$ (n=1, . . . , N) of the present frame also in the first coding unit 101.

Moreover, if the MDCT coefficient sequence $X_{f-1}(n)$ (n=1, . . . , N) of the preceding frame was coded in the second coding unit 201 and the information on whether or not switching is permitted that was obtained by the switching permission judgment unit 381 indicates that switching is not permitted, the switching selection unit 383 selects to code the MDCT coefficient sequence $X_f(n)$ (n=1, . . . , N) of the present frame also in the second coding unit 201. Furthermore, if the MDCT coefficient sequence $X_{f-1}(n)$ (n=1, . . . , N) of the preceding frame was coded in the second coding unit 201 and the information (suitability information) on which coding processing is suitable that was obtained by the suitable coding processing judgment unit 382 indicates the coding processing of the second coding unit 201, the switching selection unit 383 selects to code the MDCT coefficient sequence $X_f(n)$ (n=1, . . . , N) of the present frame also in the second coding unit 201. In addition, if the MDCT coefficient sequence $X_{f-1}(n)$ (n=1, . . . , N) of the preceding frame was coded in the second coding unit 201 and the information (suitability information) on which coding processing is suitable that was obtained by the suitable coding processing judgment unit 382 indicates that both the coding processing of the first coding unit 101 and the coding processing of the second coding unit 201 are suitable, the switching selection unit 383 selects to code the MDCT coefficient sequence $X_f(n)$ (n=1, . . . , N) of the present frame also in the second coding unit 201.

If the information on whether or not switching is permitted that was obtained by the switching permission judgment unit 381 indicates that switching is permitted and the information (suitability information) on which coding processing is suitable that was obtained by the suitable coding processing judgment unit 382 indicates coding processing which is different from the coding processing performed on the MDCT coefficient sequence $X_{f-1}(n)$ (n=1, . . . , N) of the preceding frame, the switching selection unit 383 selects the coding processing which is different from the coding processing performed on the MDCT coefficient sequence $X_{f-1}(n)$ (n=1, . . . , N) of the preceding frame as the coding processing which is performed on the MDCT coefficient sequence $X_f(n)$ (n=1, . . . , N) of the present frame. That is, if the MDCT coefficient sequence $X_{f-1}(n)$ (n=1, . . . , N) of the preceding frame was coded in the first coding unit 101, the information on whether or not switching is permitted that was obtained by the switching permission judgment unit 381 indicates that switching is permitted, and the information (suitability information) on which coding processing is suitable that was obtained by the suitable coding processing judgment unit 382 indicates the coding processing of the second coding unit 201, the switching selection unit 383 selects to code the MDCT coefficient sequence $X_f(n)$ (n=1, . . . , N) of the present frame in the second coding unit 201. Moreover, if the MDCT coefficient sequence $X_{f-1}(n)$ (n=1, . . . , N) of the preceding frame was coded in the second coding unit 201, the information on whether or not switching is permitted that was obtained by the switching permission judgment unit 381 indicates that switching is permitted, and the information (suitability information) on which coding processing is suitable that was obtained by the suitable coding processing judgment unit 382 indicates the coding processing of the first coding unit 101, the switching selection unit 383 selects to code the MDCT coefficient sequence $X_f(n)$ (n=1, . . . , N) of the present frame in the first coding unit 101.

Incidentally, if the suitable coding processing judgment unit 382 is configured so as not to output the judgment result if it is judged that the coefficient sequence in the frequency domain corresponding to the input sound signal of the present frame is suitable for both the coding processing of the first coding unit 101 and the coding processing of the second coding unit 201, the switching selection unit 383 simply has to perform, if the information on suitable coding processing is not input thereto, processing which is performed when the above-described information (suitability information) on which coding processing is suitable indicates that both the coding processing of the first coding unit 101 and the coding processing of the second coding unit 201 are suitable.

First Modification

As a judgment as to whether the input sound signal of the present frame is suitable for the coding processing using a spectral envelope based on coefficients which are convertible into linear prediction coefficients, which is illustrated in Non-patent Literature 1, or the coding processing involving variable-length coding which is performed on a differential between the logarithmic value of the average energy of coefficients in each frequency domain obtained by division and the logarithmic value of the average energy of an adjacent frequency domain, which is illustrated in Non-patent Literature 2, a judgment including not only the magnitude of the ascents and descents of a spectral envelope of the input sound signal and the degree of concentration of the spectral envelope, but also the other information may be made.

For example, even when the coefficient sequence in the frequency domain corresponding to the input sound signal of the preceding frame was coded by the first coding unit 101, the switching permission judgment unit 381 judges that switching is permitted, and the suitable coding processing judgment unit 382 judges that the coefficient sequence in the frequency domain corresponding to the input sound signal of the present frame is suitable for the coding processing of the second coding unit 201, if it is judged that the coefficient sequence in the frequency domain corresponding to the input sound signal of the present frame has to be coded by the coding processing of the first coding unit 101 based on the other information obtained by a means which is not depicted in the coding device 300, the coefficient sequence in the frequency domain corresponding to the input sound signal of the present frame may be coded by the first coding unit 101. That is, the coding device 300 simply has to be configured so as to make it possible to select to code the coefficient sequence in the frequency domain corresponding to the input sound signal of the present frame by the second coding unit 201 if the coefficient sequence in the frequency domain corresponding to the input sound signal of the preceding frame was coded by the first coding unit 101, the switching permission judgment unit 381 judges that switching is permitted, and the suitable coding processing judgment unit 382 judges that the coefficient sequence in the frequency domain corresponding to the input sound signal of the present frame is suitable for the coding processing of the second coding unit 201.

Moreover, conversely, even when the coefficient sequence in the frequency domain corresponding to the input sound signal of the preceding frame was coded by the second coding unit 201, the switching permission judgment unit 381 judges that switching is permitted, and the suitable coding processing judgment unit 382 judges that the coefficient sequence in the frequency domain corresponding to the input sound signal of the present frame is suitable for the coding processing of the first coding unit 101, if it is judged that the coefficient sequence in the frequency domain corresponding to the input sound signal of the present frame has to be coded by the coding processing of the second coding unit 201 based on the other information obtained by a means which is not depicted in the coding device 300, the coefficient sequence in the frequency domain corresponding to the input sound signal of the present frame may be coded by the second coding unit 201. That is, the coding device 300 simply has to be configured so as to make it possible to select to code the coefficient sequence in the frequency domain corresponding to the input sound signal of the present frame by the first coding unit 101 if the coefficient sequence in the frequency domain corresponding to the input sound signal of the preceding frame was coded by the second coding unit 201, the switching permission judgment unit 381 judges that switching is permitted, and the suitable coding processing judgment unit 382 judges that the coefficient sequence in the frequency domain corresponding to the input sound signal of the present frame is suitable for the coding processing of the first coding unit 101.

Furthermore, for example, in the coding device 300 of the third embodiment, even when the coefficient sequence in the frequency domain corresponding to the input sound signal of the preceding frame was coded by the first coding unit 101 and the suitable coding processing judgment unit 382 judges that the coefficient sequence in the frequency domain corresponding to the input sound signal of the present frame is suitable for both the coding processing of the first coding unit 101 and the coding processing of the second coding unit 201, if the switching permission judgment unit 381 judges that switching is permitted and it is judged that the coefficient sequence in the frequency domain corresponding to the input sound signal of the present frame has to be coded by the coding processing of the second coding unit 201 based on the other information obtained by a means which is not depicted in the coding device 300, the coefficient sequence in the frequency domain corresponding to the input sound signal of the present frame may be coded by the second coding unit 201.

Moreover, conversely, even when the coefficient sequence in the frequency domain corresponding to the input sound signal of the preceding frame was coded by the second coding unit 201 and the suitable coding processing judgment unit 382 judges that the coefficient sequence in the frequency domain corresponding to the input sound signal of the present frame is suitable for both the coding processing of the first coding unit 101 and the coding processing of the second coding unit 201, if the switching permission judgment unit 381 judges that switching is permitted and it is judged that the coefficient sequence in the frequency domain corresponding to the input sound signal of the present frame has to be coded by the coding processing of the first coding unit 101 based on the other information obtained by a means which is not depicted in the coding device 300, the coefficient sequence in the frequency domain corresponding to the input sound signal of the present frame may be coded by the first coding unit 101.

That is, the coding device 300 of the third embodiment simply has to be configured so as to make it possible to select to code the coefficient sequence in the frequency domain corresponding to the input sound signal of the present frame by the same coding processing as the coding processing of the preceding frame if the switching permission judgment unit 381 judges that switching is permitted and the suitable coding processing judgment unit 382 judges that the coefficient sequence in the frequency domain corresponding to the input sound signal of the present frame is suitable for both the coding processing of the first coding unit 101 and the coding processing of the second coding unit 201.

Second Modification

For a selection as to whether to code the coefficient sequence in the frequency domain of the present frame in the first coding unit 101 or in the second coding unit 201, the information on whether or not switching is permitted that was obtained by the switching permission judgment unit 381 may not be used. In this case, the switching permission judgment unit 381 does not have to be provided in the selection unit 380.

In this case, the switching selection unit 383 selects whether to code the coefficient sequence in the frequency domain of the present frame in the first coding unit 101 or in the second coding unit 201 based on the suitability information obtained by the suitable coding processing judgment unit 382 without using the information on whether or not switching is permitted that was obtained by the switching permission judgment unit 381, and outputs a switching code that is a code by which the selected coding processing can be identified.

For example, it is necessary simply to code the coefficient sequence in the frequency domain corresponding to the input sound signal of the present frame by the first coding unit 101 if the suitable coding processing judgment unit 382 judges that the coefficient sequence in the frequency domain corresponding to the input sound signal of the present frame is suitable for the coding processing of the first coding unit 101 and code the coefficient sequence in the frequency domain corresponding to the input sound signal of the present frame by the second coding unit 201 if the suitable coding processing judgment unit 382 judges that the coefficient sequence in the frequency domain corresponding to the input sound signal of the present frame is suitable for the coding processing of the second coding unit 201.

Also in this case, as is the case with the first modification, a judgment including the other information may be made. For example, even when the suitable coding processing judgment unit 382 judges that the coefficient sequence in the frequency domain corresponding to the input sound signal of the present frame is suitable for the coding processing of the first coding unit 101, if it is judged that the coefficient sequence in the frequency domain corresponding to the input sound signal of the present frame has to be coded by the coding processing of the second coding unit 201 based on the other information obtained by a means which is not depicted in the coding device 300, the coefficient sequence in the frequency domain corresponding to the input sound signal of the present frame may be coded by the second coding unit 201.

Conversely, even when the suitable coding processing judgment unit 382 judges that the coefficient sequence in the frequency domain corresponding to the input sound signal of the present frame is suitable for the coding processing of the second coding unit 201, if it is judged that the coefficient sequence in the frequency domain corresponding to the input sound signal of the present frame has to be coded by the coding processing of the first coding unit 101 based on the other information obtained by a means which is not depicted in the coding device 300, the coefficient sequence in the frequency domain corresponding to the input sound signal of the present frame may be coded by the first coding unit 101.

That is, a configuration simply has to be a configuration that makes it possible to select to code the coefficient sequence in the frequency domain corresponding to the input sound signal of the present frame by the coding processing of the first coding unit 101 if the suitable coding processing judgment unit 382 judges that the coefficient sequence in the frequency domain corresponding to the input sound signal of the present frame is suitable for the coding processing of the first coding unit 101. Moreover, a configuration simply has to be a configuration that makes it possible to select to code the coefficient sequence in the frequency domain corresponding to the input sound signal of the present frame by the coding processing of the second coding unit 201 if the suitable coding processing judgment unit 382 judges that the coefficient sequence in the frequency domain corresponding to the input sound signal of the present frame is suitable for the coding processing of the second coding unit 201.

Furthermore, for example, in the coding device 300 of the third embodiment, of cases where the suitable coding processing judgment unit 382 judges that the coefficient sequence in the frequency domain corresponding to the input sound signal of the present frame is suitable for both the coding processing of the first coding unit 101 and the coding processing of the second coding unit 201, in a case where it is judged that the coefficient sequence in the frequency domain corresponding to the input sound signal of the present frame has to be coded by the coding processing of the first coding unit 101 based on the other information obtained by a means which is not depicted in the coding device 300, the coefficient sequence in the frequency domain corresponding to the input sound signal of the present frame may be coded by the first coding unit 101.

Moreover, of cases where the suitable coding processing judgment unit 382 judges that the coefficient sequence in the frequency domain corresponding to the input sound signal of the present frame is suitable for both the coding processing of the first coding unit 101 and the coding processing of the second coding unit 201, in a case where it is judged that the coefficient sequence in the frequency domain corresponding to the input sound signal of the present frame has to be coded by the coding processing of the second coding unit 201 based on the other information obtained by a means which is not depicted in the coding device 300, the coefficient sequence in the frequency domain corresponding to the input sound signal of the present frame may be coded by the second coding unit 201.

That is, the coding device 300 of the third embodiment simply has to be configured so as to make it possible to select to code the coefficient sequence in the frequency domain corresponding to the input sound signal of the present frame by the same coding processing as the coding processing of the preceding frame if the suitable coding processing judgment unit 382 judges that the coefficient sequence in the frequency domain corresponding to the input sound signal of the present frame is suitable for both the coding processing of the first coding unit 101 and the coding processing of the second coding unit 201.

Incidentally, in a comparison between the calculated value and the threshold value in the above-described embodiments, settings simply have to be made such that, if the calculated value is the same value as the threshold value, the calculated value is classified into any one of two cases adjacent to each other with the threshold value placed therebetween as a boundary. That is, a condition that a value is greater than or equal to a certain threshold value may translate into a condition that a value is greater than that threshold value and a condition that a value is smaller than that threshold value may translate into a condition that a value is smaller than or equal to that threshold value. Moreover, a condition that a value is greater than a certain threshold value may translate into a condition that a value is greater than or equal to that threshold value and a condition that a value is smaller than or equal to that threshold value may translate into a condition that a value is smaller than that threshold value.

For example, in the first embodiment, the selection unit 380 may make it possible to select coding processing which is different from the coding processing of the preceding frame as the coding processing of the present frame if at least one of the magnitude of the energy of high frequency components of the input sound signal of the preceding frame and the magnitude of the energy of high frequency components of the input sound signal of the present frame is smaller than or equal to a predetermined threshold value (Step S380).

Moreover, in the second embodiment, the switching permission judgment unit 381 may judge that switching is permitted, that is, the switching permission judgment unit 381 makes it possible to code the coefficient sequence in the frequency domain of the present frame by coding processing which is different from the coding processing by which the coefficient sequence in the frequency domain of the preceding frame was coded if at least one of the magnitude of the energy of high frequency components of the input sound signal of the preceding frame and the magnitude of the energy of high frequency components of the input sound signal of the present frame is smaller than or equal to a predetermined threshold value and output the judgment result.

Furthermore, in the first embodiment, if a difference between the mean value E of $AVE_{XS}(q)$ of all the partial regions and the mean value $E_V$ of $AVE_{XS}(q)$ of the partial regions of the valley is smaller than the predetermined threshold value TH2, since it is estimated that the valley of a spectrum is shallow and the spectrum is a spectrum whose spectral envelope has gentle ascents and descents or whose degree of concentration is low, the suitable coding processing judgment unit 382 may judge that the coefficient sequence in the frequency domain corresponding to the input sound signal of the present frame is suitable for the coding processing of the second coding unit 201. Conversely, if a difference between the mean value E of $AVE_{XS}(q)$ of all the partial regions and the mean value $E_V$ of $AVE_{XS}(q)$ of the partial regions of the valley is greater than or equal to the threshold value TH2, since it is estimated that the valley of a spectrum is deep and the spectrum is a spectrum whose spectral envelope has steep ascents and descents or whose degree of concentration is high, the suitable coding processing judgment unit 382 may judge that the coefficient sequence in the frequency domain corresponding to the input sound signal of the present frame is suitable for the coding processing of the first coding unit 101.

Moreover, in the third embodiment, if a difference between the mean value E of $AVE_{XS}(q)$ of all the partial regions and the mean value $E_V$ of $AVE_{XS}(q)$ of the partial regions of the valley is greater than or equal to the predetermined threshold value TH2_2 which is a value greater than the threshold value TH2_1, since it is estimated that the valley of a spectrum is deep and the spectrum is a spectrum whose spectral envelope has steep ascents and descents or whose degree of concentration is high, the suitable coding processing judgment unit 382 may judge that the coefficient sequence in the frequency domain corresponding to the input sound signal of the present frame is suitable for the coding processing of the first coding unit 101. In this case, if a difference between the mean value E of $AVE_{XS}(q)$ of all the partial regions and the mean value $E_V$ of $AVE_{XS}(q)$ of the partial regions of the valley is greater than or equal to the threshold value TH2_1 but smaller than the threshold value TH2_2, since it is estimated that the depth of the valley of a spectrum is medium and the spectrum is a spectrum whose spectral envelope has moderate ascents and descents or whose degree of concentration is medium, the suitable coding processing judgment unit 382 may perform any one of the coding processing of the first coding unit 101 and the coding processing of the second coding unit 201 on the coefficient sequence in the frequency domain corresponding to the input sound signal of the present frame.

The processing described in the coding device and the coding method may be performed, in addition to being performed in chronological order in the order mentioned in the description, in parallel or individually depending on the processing power of a device that performs the processing or when needed.

Moreover, when the steps in the coding method are implemented by a computer, the processing details of the functions supposed to be provided in the coding method are described by a program. As a result of this program being executed by the computer, the steps are implemented on the computer.

The program describing the processing details can be recorded on a computer-readable recording medium. As the computer-readable recording medium, any computer-readable recording medium, such as a magnetic recording device, an optical disk, a magneto-optical recording medium, semiconductor memory, or the like, may be used.

Furthermore, each processing means may be configured as a result of a predetermined program being executed on the computer, and at least part of the processing details thereof may be implemented on the hardware.

It goes without saying that changes may be made as appropriate without departing from the spirit of this invention.

What is claimed is:

1. A coding method that codes an input sound signal frame by frame of a predetermined time segment by a selected coding processing from a plurality of types of coding processing in a frequency domain, the coding method comprising:
   a selection step of making possible a selection to select coding processing which is different from coding processing of a preceding frame as coding processing of a present frame if
   (1) at least one of
      (1-1) a magnitude of energy of high frequency components which are components more than or equal to a first predetermined frequency and less than or equal to a second predetermined frequency, the first predetermined frequency being more than lowest frequency components among the input sound signal of the preceding frame, the second predetermined frequency being highest frequency components among the input sound signal of the preceding frame, and
      (1-2) a magnitude of energy of high frequency components which are components more than or equal to a third predetermined frequency and less than or equal to a fourth predetermined frequency, the third predetermined frequency being more than lowest frequency components among the input sound signal of the present frame, the fourth predetermined frequency being highest frequency components among the input sound signal of the present frame is smaller than or equal to a predetermined threshold value, or
(2) at least one of
(2-1) a ratio of energy of the high frequency components to a total energy of the input sound signal of the preceding frame, and
(2-2) a ratio of energy of the high frequency components to a total energy of the input sound signal of the present frame
is smaller than or equal to a predetermined threshold value,
the coding method further comprising:
a first coding step of coding a coefficient sequence in the frequency domain corresponding to the input sound signal by using a spectral envelope based on coefficients which are convertible into linear prediction coefficients corresponding to the input sound signal; and
a second coding step of coding the coefficient sequence in the frequency domain corresponding to the input sound signal, involving variable-length coding which is performed on a differential between a logarithmic value of average energy of coefficients in each partial region obtained by dividing the coefficient sequence in the frequency domain corresponding to the input sound signal into a plurality of partial regions and a logarithmic value of average energy of an adjacent frequency domain, wherein
the selection step further selects to code the present frame in the second coding step in a case where the input sound signal of the preceding frame was coded in the first coding step and an index indicating ascents and descents of a spectrum of the input sound signal of the present frame or an index indicating a degree of concentration of the spectrum is smaller than a predetermined threshold value, of cases where adopting coding processing which is different from the coding processing of the preceding frame as the coding processing of the present frame is made possible.

2. A coding method that codes an input sound signal frame by frame of a predetermined time segment by a selected coding processing from a plurality of types of coding processing in a frequency domain, the coding method comprising:
a selection step of making possible a selection to select coding processing which is different from coding processing of a preceding frame as coding processing of a present frame if
(1) at least one of
(1-1) a magnitude of energy of high frequency components which are components more than or equal to a first predetermined frequency and less than or equal to a second predetermined frequency, the first predetermined frequency being more than lowest frequency components among the input sound signal of the preceding frame, the second predetermined frequency being highest frequency components among the input sound signal of the preceding frame, and
(1-2) a magnitude of energy of high frequency components which are components more than or equal to a third predetermined frequency and less than or equal to a fourth predetermined frequency, the third predetermined frequency being more than lowest frequency components among the input sound signal of the present frame, the fourth predetermined frequency being highest frequency components among the input sound signal of the present frame
is smaller than or equal to a predetermined threshold value, or
(2) at least one of
(2-1) a ratio of energy of the high frequency components to a total energy of the input sound signal of the preceding frame, and
(2-2) a ratio of energy of the high frequency components to a total energy of the input sound signal of the present frame
is smaller than or equal to a predetermined threshold value,
the coding method further comprising:
a first coding step of coding a coefficient sequence in the frequency domain corresponding to the input sound signal by using a spectral envelope based on coefficients which are convertible into linear prediction coefficients corresponding to the input sound signal; and
a second coding step of coding the coefficient sequence in the frequency domain corresponding to the input sound signal, involving variable-length coding which is performed on a differential between a logarithmic value of average energy of coefficients in each partial region obtained by dividing the coefficient sequence in the frequency domain corresponding to the input sound signal into a plurality of partial regions and a logarithmic value of average energy of an adjacent frequency domain, wherein
the selection step further makes possible a selection to code the present frame in the first coding step in a case where the input sound signal of the preceding frame was coded in the second coding step and an index indicating ascents and descents of a spectrum of the input sound signal of the present frame or an index indicating a degree of concentration of the spectrum is greater than or equal to a predetermined threshold value, of cases where adopting coding processing which is different from the coding processing of the preceding frame as the coding processing of the present frame is made possible.

3. A coding device that codes an input sound signal frame by frame of a predetermined time segment by a selected coding processing from a plurality of types of coding processing in a frequency domain, the coding device comprising:
processing circuitry configured to
perform a selection step that makes possible a selection to select coding processing which is different from coding processing of a preceding frame as coding processing of a present frame if
(1) at least one of
(1-1) a magnitude of energy of high frequency components which are components more than or equal to a first predetermined frequency and less than or equal to a second predetermined frequency, the first predetermined frequency being more than lowest frequency components among the input sound signal of the preceding frame, the second predetermined frequency being highest frequency components among the input sound signal of the preceding frame, and
(1-2) a magnitude of energy of high frequency components which are components more than or equal to a third predetermined frequency and less than or equal to a fourth predetermined frequency, the third predetermined frequency being more than lowest frequency components among the input sound signal of the present frame, the fourth predetermined frequency being highest frequency components among the input sound signal of the present frame is smaller than or equal to a predetermined threshold value, or (2) at least one of (2-1) a ratio of energy of the high frequency components to a total energy of the input sound signal of the preceding frame, and (2-2) a ratio of energy of the high frequency components to a total energy of the input sound signal of the present frame is smaller than or equal to a predetermined threshold value, the processing circuitry further configured to:

perform a first coding step that codes a coefficient sequence in a frequency domain corresponding to the input sound signal by using a spectral envelope based on coefficients which are convertible into linear prediction coefficients corresponding to the input sound signal; and perform a second coding step that codes the coefficient sequence in the frequency domain corresponding to the input sound signal, involving variable-length coding which is performed on a differential between a logarithmic value of average energy of coefficients in each partial region obtained by dividing the coefficient sequence in the frequency domain corresponding to the input sound signal into a plurality of partial regions and a logarithmic value of average energy of an adjacent frequency domain, wherein the processing circuitry further selects to code the present frame in the second coding step in a case where the input sound signal of the preceding frame was coded in the first coding step and an index indicating ascents and descents of a spectrum of the input sound signal of the present frame or an index indicating a degree of concentration of the spectrum is smaller than a predetermined threshold value, of cases where adopting coding processing which is different from the coding processing of the preceding frame as the coding processing of the present frame is made possible.

4. A coding device that codes an input sound signal frame by frame of a predetermined time segment by a selected coding processing from a plurality of types of coding processing in a frequency domain, the coding device comprising:

processing circuitry configured to perform a selection step that makes possible a selection to select coding processing which is different from coding processing of a preceding frame as coding processing of a present frame if (1) at least one of (1-1) a magnitude of energy of high frequency components which are components more than or equal to a first predetermined frequency and less than or equal to a second predetermined frequency, the first predetermined frequency being more than lowest frequency components among the input sound signal of the preceding frame, the second predetermined frequency being highest frequency components among the input sound signal of the preceding frame, and (1-2) a magnitude of energy of high frequency components which are components more than or equal to a third predetermined frequency and less than or equal to a fourth predetermined frequency, the third predetermined frequency being more than lowest frequency components among the input sound signal of the present frame, the fourth predetermined frequency being highest frequency components among the input sound signal of the present frame is smaller than or equal to a predetermined threshold value, or (2) at least one of (2-1) a ratio of energy of the high frequency components to a total energy of the input sound signal of the preceding frame, and (2-2) a ratio of energy of the high frequency components to a total energy of the input sound signal of the present frame is smaller than or equal to a predetermined threshold value, the processing circuitry further configured to:

perform a first coding step that codes a coefficient sequence in a frequency domain corresponding to the input sound signal by using a spectral envelope based on coefficients which are convertible into linear prediction coefficients corresponding to the input sound signal; and perform a second coding step that codes the coefficient sequence in the frequency domain corresponding to the input sound signal, involving variable-length coding which is performed on a differential between a logarithmic value of average energy of coefficients in each partial region obtained by dividing the coefficient sequence in the frequency domain corresponding to the input sound signal into a plurality of partial regions and a logarithmic value of average energy of an adjacent frequency domain, wherein the processing circuitry further makes possible a selection to code the present frame in the first coding step in a case where the input sound signal of the preceding frame was coded in the second coding step and an index indicating ascents and descents of a spectrum of the input sound signal of the present frame or an index indicating a degree of concentration of the spectrum is greater than or equal to a predetermined threshold value, of cases where adopting coding processing which is different from the coding processing of the preceding frame as the coding processing of the present frame is made possible.

5. A non-transitory computer-readable recording medium on which a program for making a computer execute each step of the coding method according to any one of claims 1 to 2 is recorded.

* * * * *